(12) United States Patent
Kim et al.

(10) Patent No.: US 10,483,284 B2
(45) Date of Patent: Nov. 19, 2019

(54) LOGIC SEMICONDUCTOR DEVICE

(71) Applicant: KOREA UNIVERSITY RESEARCH AND BUSINESS FOUNDATION, Seoul (KR)

(72) Inventors: Sangsig Kim, Seoul (KR); Kyoungah Cho, Seoul (KR); Minsuk Kim, Gyeonggi-do (KR); Yoonjoong Kim, Seoul (KR); Sola Woo, Gyeonggi-do (KR); Doohyeok Lim, Seoul (KR)

(73) Assignee: Korea University Research and Business Foundation, Seoul (KR)

(*) Notice: Subject to any disclaimer, the term of this patent is extended or adjusted under 35 U.S.C. 154(b) by 0 days.

(21) Appl. No.: 15/870,092

(22) Filed: Jan. 12, 2018

(65) Prior Publication Data

US 2018/0138200 A1    May 17, 2018

Related U.S. Application Data

(63) Continuation of application No. PCT/KR2017/010324, filed on Sep. 20, 2017.

(30) Foreign Application Priority Data

Sep. 26, 2016    (KR) .................. 10-2016-0123389

(51) Int. Cl.
*H01L 27/118* (2006.01)
*G06N 3/04* (2006.01)
(Continued)

(52) U.S. Cl.
CPC .......... *H01L 27/11807* (2013.01); *G06N 3/04* (2013.01); *G06N 3/06* (2013.01);
(Continued)

(58) Field of Classification Search
CPC .......... H01L 27/11807; H01L 27/0688; H01L 29/749; H01L 27/1027; H01L 2027/11875;
(Continued)

(56) References Cited

U.S. PATENT DOCUMENTS 5,612,563 A    3/1997    Fitch et al.
7,791,108 B2    9/2010    Hurkx et al.
(Continued)

FOREIGN PATENT DOCUMENTS

KR    1020080096789 A    11/2008
KR    10-2011-0053201 A    5/2011
(Continued)

OTHER PUBLICATIONS

Korean Office Action for Application No. 10-2016-0123389 dated Sep. 27, 2017.
(Continued)

*Primary Examiner* — Cuong B Nguyen
(74) *Attorney, Agent, or Firm* — Jenkins, Wilson, Taylor & Hunt, P.A.

(57) ABSTRACT

A semiconductor device includes stacked transistors. Each of the transistors includes a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region. A gate electrode is disposed to cover the intrinsic region, and a gate insulating layer is disposed between the gate electrode and the intrinsic region.

15 Claims, 36 Drawing Sheets

(51) Int. Cl.
*G06N 3/06* (2006.01)
*G11C 11/39* (2006.01)
*H01L 29/749* (2006.01)
*H01L 27/06* (2006.01)
*G11C 11/54* (2006.01)
*H01L 21/8238* (2006.01)
*H01L 27/092* (2006.01)
*H01L 27/102* (2006.01)
*G06N 3/063* (2006.01)

(52) U.S. Cl.
CPC ............. *G11C 11/39* (2013.01); *G11C 11/54* (2013.01); *H01L 21/823814* (2013.01); *H01L 21/823885* (2013.01); *H01L 27/0688* (2013.01); *H01L 27/092* (2013.01); *H01L 29/749* (2013.01); *G06N 3/063* (2013.01); *H01L 27/1027* (2013.01); *H01L 2027/11838* (2013.01); *H01L 2027/11875* (2013.01)

(58) Field of Classification Search
CPC ......... H01L 2027/11838; H01L 29/083; H01L 29/0834; H01L 29/0839; H01L 29/1012–102; H01L 29/41716; H01L 29/42308; H01L 29/87; H01L 27/0817; H01L 29/7424; H01L 29/66356; H01L 29/66363–66401; H01L 29/74–749; H01L 2924/1301–13035; G11C 11/54; G11C 11/39; G06N 3/06; G06N 3/04

See application file for complete search history.

(56) References Cited

U.S. PATENT DOCUMENTS

| | | | |
|---|---|---|---|
| 8,901,640 B2 | 12/2014 | Masuoka et al. | |
| 9,299,805 B2 | 3/2016 | Park | |
| 9,461,165 B2 | 10/2016 | Masuoka et al. | |
| 2005/0280061 A1* | 12/2005 | Lee .................... | H01L 21/2007 257/296 |
| 2013/0241004 A1 | 9/2013 | Yin et al. | |
| 2016/0064535 A1* | 3/2016 | Verhulst ............. | H01L 29/7391 257/12 |

FOREIGN PATENT DOCUMENTS

| | | |
|---|---|---|
| KR | 10-2015-0020848 A | 2/2015 |
| WO | WO 2014/199481 A1 | 12/2014 |

OTHER PUBLICATIONS

International Search Report for Korean Application No. PCT/KR2017/010324 dated Jan. 29, 2018.

Korean Notice of Allowance for Application No. 10-2016-0123389 dated Apr. 30, 2018.

English Translation of the International Preliminary Report on Patentability and Written Opinion for Application No. PCT/KR2017/010324 dated Mar. 26, 2019.

* cited by examiner n-channel n-channel n-channel FET p-channel FET

LOGIC SEMICONDUCTOR DEVICE

CROSS-REFERENCE TO RELATED APPLICATIONS

This application is a continuation of and claims priority to PCT/KR2017/010324 filed on Sep. 20, 2017, which claims priority to Korea Patent Application No. 10-2016-0123389 filed on Sep. 26, 2016, the entireties of which are both incorporated by reference herein.

TECHNICAL FIELD

The present disclosure relates to logic silicon semiconductor devices and, more particularly, to a logic semiconductor device driven with the positive feedback loop mechanism of a p-n-i-n nanostructure device.

BACKGROUND

In a conventional computer based on von Neumann architecture, a program stored in a memory is executed while continuing to access data stored in the memory. With the improvement in computer performance, evolution and development have been made in the form of raising an importance on parallel processing to overcome a bottleneck of data processing speed. However, since there is a limitation in processing a large amount of data that increases geometrically, there is a need to develop a new type of microprocessor.

Neurons and synapses connected in parallel enable a human neutral network to simultaneously perform memorization, operation, and inference with low power. Thus, the human neural network is capable of performing higher-level application processing than a computer based on von Neumann architecture. A neuromorphic technology is a technology for mimicking such a human neural network to hardware based on CMOS integrated circuit technology.

However, a current neuromorphic technology encounters difficulties in integrating large-scale neurons and synapses and implementing a learning function of neurons based on an existing CMOS process. To implement the learning function, a separate processor for controlling a leaning operation is required outside a chip, which serves as a great restriction for commercialization. Accordingly, there is a need to develop a logic device that utilizes an existing CMOS process but makes a new type of memorization possible.

U.S. Pat. No. 5,612,563 discloses a logic device using a vertical MOS transistor. However, U.S. Pat. No. 5,612,563 cannot provide a logic device that memorizes a previous sate because previous state data is lost when an input signal is removed at a gate electrode.

SUMMARY

A feature of the present disclosure is to provide a synapse-mimicking device that may utilize an existing CMOS process.

Another feature of the present disclosure is to provide a neuron-mimicking device that may perform logical operation and memorization.

Another feature of the present disclosure is to provide a device that overcomes processing speed and integration limitations caused by separation of a memory and a processor.

Another feature of the present disclosure is to provide a next-generation neuromorphic device that may perform processing with low power consumption like a human brain.

A semiconductor device according to an example embodiment of the present disclosure includes a plurality of stacked transistors. Each of the transistors may include: a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region; a gate electrode disposed to cover the intrinsic region; and a gate insulating layer disposed between the gate electrode and the intrinsic region.

In an example embodiment of the present disclosure, the plurality of stacked transistors may include a first transistor disposed at a lower portion and a second transistor disposed above the first transistor. A first conductivity type of the first transistor may be n-type, and a first conductivity type of the second transistor may be p-type.

In an example embodiment of the present disclosure, the semiconductor column of the first transistor may include the first conductive region, the intrinsic region, the barrier region, and the second conductive region which are sequentially disposed in a vertical direction. The semiconductor column of the second transistor may include the second conductive region, the barrier region, the intrinsic region, and the first conductive region which are sequentially disposed in the vertical direction.

In an example embodiment of the present disclosure, the gate electrode of the first transistor may be electrically connected to the gate electrode of the second transistor to receive an input signal indicating logic "1" or "0". The second gate electrode of the first transistor may be electrically connected to the second region of the second transistor to provide an output signal. The first conductive region of the first transistor may be grounded. The first conductive region of the second transistor may be connected to an applied voltage. The first transistor and the second transistor may provide a logic inverter. The input signal and the output signal may be opposite in sign.

In an example embodiment of the present disclosure, the logic inverter may retain an output signal of a previous state even when the input signal is removed from the gate electrode of the first transistor.

In an example embodiment of the present disclosure, the semiconductor column of the first transistor may include the second conductive region, the barrier region, the intrinsic region, and the first conductive region which are sequentially disposed in a vertical direction. The semiconductor column of the second transistor may include the second conductive region, the barrier region, the intrinsic region, and the first conductive region which are sequentially disposed in the vertical direction.

In an example embodiment of the present disclosure, the plurality of stacked transistors may include a first transistor disposed at a lower portion and a second transistor disposed above the first transistor. The first conductivity type of the first transistor may be p-type, and the first conductivity type of the second transistor may be n-type.

In an example embodiment of the present disclosure, the plurality of stacked transistors may include a pair of first transistors disposed at a lower layer and a pair of second transistors disposed at an upper layer. The first transistor and the second transistor may constitute a NOR logic circuit or a NAND logic circuit.

In an example embodiment of the present disclosure, an input signal applied to the gate electrode of the transistor may be a positive first gate voltage indicating a first logic state and a negative second gate voltage indicating a second logic state. The NOR logic circuit or the NAND logic circuit may output data of a previous state even when the input signal is removed.

In an example embodiment of the present disclosure, the plurality of stacked transistors may include a pair of first transistors disposed at a lower layer and a pair of second transistors disposed at an upper layer. The semiconductor column of the first transistor may include the first conductive region, the intrinsic region, the barrier region, and the second conductive region which are sequentially disposed in a vertical direction. The semiconductor column of the second transistor may include the second conductive region, the barrier region, the intrinsic region, and the first conductive region which are sequentially disposed in the vertical direction. The first transistor and the second transistor may constitute a NOR logic circuit or a NAND logic circuit.

In an example embodiment of the present disclosure, the plurality of stacked transistors may include a pair of first transistors disposed at a lower layer and a pair of second transistors disposed at an upper layer. The semiconductor column of the first transistor may include the second conductive region, the barrier region, the intrinsic region, and the first conductive region which are sequentially disposed in a vertical direction. The semiconductor column of the second transistor may include the second conductive region, the barrier region, the intrinsic region, and the first conductive region which are sequentially disposed in the vertical direction. The first transistor and the second transistor may constitute a NOR logic circuit or a NAND logic circuit.

In an example embodiment of the present disclosure, the first conductivity type of the first transistor may be p-type, and the first conductivity type of the second transistor may be n-type.

In an example embodiment of the present disclosure, the plurality of stacked transistors may include a first transistor disposed at a lower layer and a second transistor disposed at an upper layer. The first transistor may include: a first lower interlayer dielectric disposed on a substrate; a second lower interlayer dielectric disposed on the first lower interlayer dielectric; a lower gate electrode disposed between the first lower interlayer dielectric and the second lower interlayer dielectric; a lower semiconductor column disposed through the second lower interlayer dielectric, the lower gate electrode, and the first lower interlayer dielectric; a lower gate insulating layer disposed between the lower semiconductor column and the lower gate electrode; a lower interconnection disposed on the second lower interlayer dielectric and the lower semiconductor column; and a third lower interlayer dielectric disposed on the lower interconnection.

In an example embodiment of the present disclosure, the second transistor may include: a first upper interlayer dielectric disposed on the third lower interlayer dielectric; a second upper interlayer dielectric disposed on the first upper interlayer dielectric; an upper gate electrode disposed between the first upper interlayer dielectric and the second upper interlayer dielectric; an upper semiconductor column disposed through the second upper interlayer dielectric, the upper gate electrode, and the first upper interlayer dielectric; an upper gate insulating layer disposed between the upper semiconductor column and the upper gate electrode; and an upper interconnection disposed between the second upper interlayer dielectric and the upper semiconductor column.

In an example embodiment of the present disclosure, the semiconductor device may further include: a lower gate isolation layer isolating the lower gate electrode; a lower auxiliary interconnection extending in contact with a bottom surface of the lower semiconductor column; and a lower interconnection contact plug connected to the lower auxiliary interconnection through the lower gate isolation layer.

In an example embodiment of the present disclosure, the semiconductor device may further include: an upper gate isolation layer isolating the upper gate electrode; an upper auxiliary interconnection extending in contact with a bottom surface of the upper semiconductor column; and an upper interconnection contact plug connected to the upper auxiliary interconnection through the upper gate isolation layer.

A semiconductor device according to an example embodiment of the present disclosure includes: a plurality of stacked transistors. Each of the transistors may include: a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region; a gate electrode disposed to cover the intrinsic region; and a gate insulating layer disposed between the gate electrode and the intrinsic region. Data of a previous state may be output even when an input voltage applied to the gate electrode is removed.

In an example embodiment of the present disclosure, the plurality of stacked transistor may include an n-channel semiconductor device in which the first conductivity type of the semiconductor column is n-type and a p-channel semiconductor device in which the first conductivity type of the semiconductor column is p-type, respectively. The plurality of stacked transistor may perform at least one of inverter, NAND, and NOR logic operations.

In an example embodiment of the present disclosure, the p-channel semiconductor device and the n-channel semiconductor device may have a stacked structure.

BRIEF DESCRIPTION OF THE DRAWINGS

The present disclosure will become more apparent in view of the attached, example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1A:
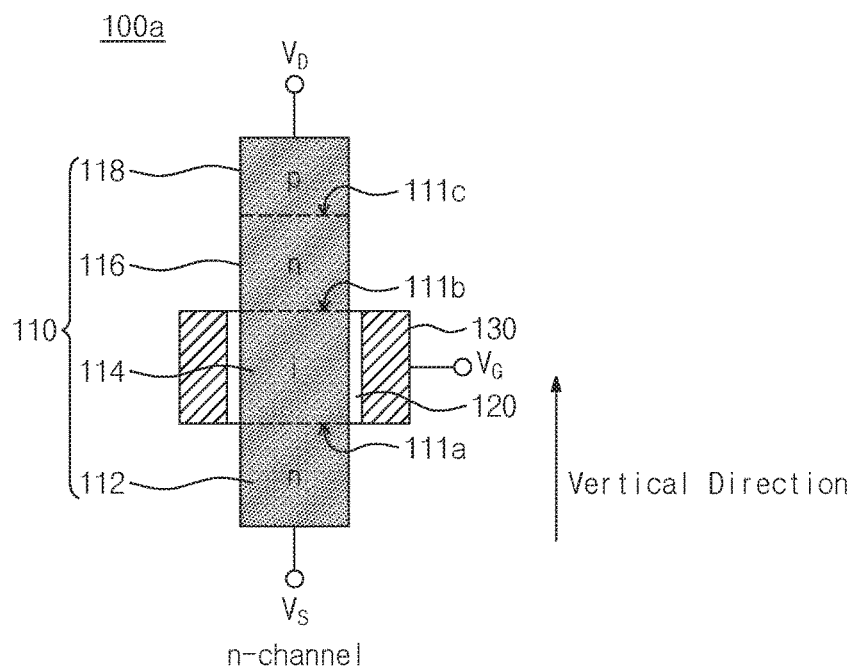
FIGS. 1A and 1B are conceptual diagrams of n-channel semiconductor devices according to an example embodiment of the present disclosure.

According to an example embodiment of the present disclosure, a memorable logic element is an element into which a memory device adopting a feedback operation mechanism is integrated and may perform memorization and logical operation by applying electrical properties exhibited as a device inner potential barrier is formed.

Existing semiconductor devices based on von Neumann architecture have been developed in the form of structurally combining a logic operation element and a memory element that are separated from each other. To mimic a human brain, a new type of element capable of performing logic operation and memorization needs to be developed. A memorable logic element proposed in the present disclosure is capable of performing a logic operation and an operation to memorize the logic operation. In this regard, the proposed memorable logic element is a higher-level element than other neuromorphic elements that simply mimic functions of a human brain. The proposed memorable logic element may be applied to not only an inverter that is a basic logic element but also logic elements such as NAND, NOR or the like and may achieve large-scale integration into an existing element based on CMOS process.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

In the present disclosure, an n-channel semiconductor device indicates a device in which opposite sides adjacent to an intrinsic region 114 of a semiconductor column 110 are doped with n-type impurities, unlike a typical MOSFET. On the other hand, a p-channel semiconductor device indicates a device in which opposite sides of the intrinsic region 114 of the semiconductor column 110 are doped with p-type impurities.

Figure 1B:
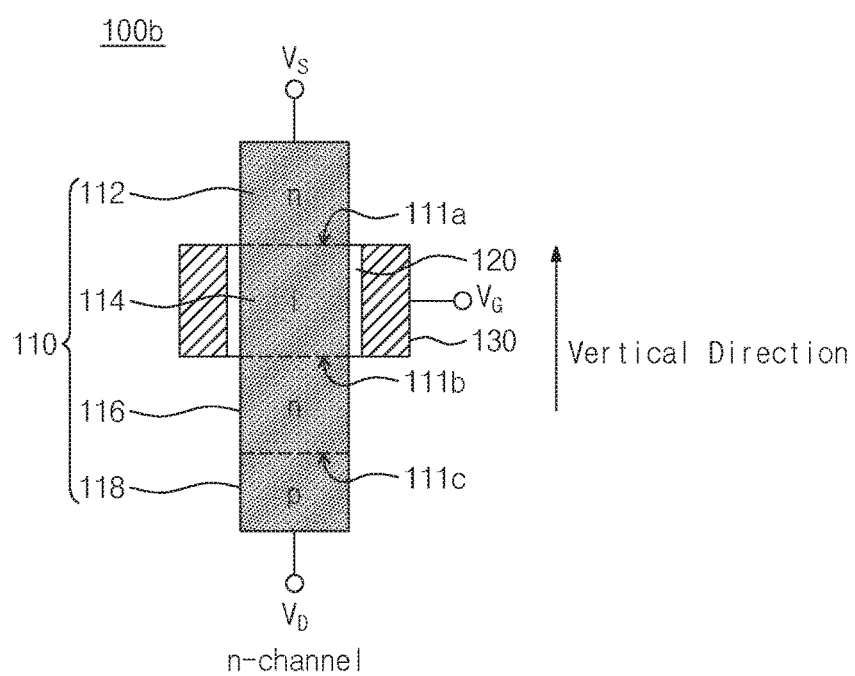

FIGS. 1A and 1B are conceptual diagrams of n-channel semiconductor devices according to an example embodiment of the present disclosure.

Figure 1C:
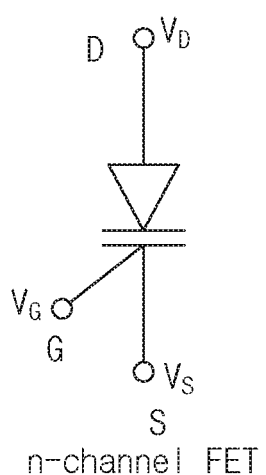
FIG. 1C is a symbol denoting the n-channel semiconductor device in FIGS. 1A and 1B.

FIG. 1C is a symbol denoting the n-channel semiconductor device in FIGS. 1A and 1B.

Referring to FIGS. 1A through 1C, a semiconductor device 100a/100b includes a semiconductor column 110 including a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114. The semiconductor device 100a/100b operates as a switch or a volatile memory according to a gate voltage applied to the gate electrode 130 and a drain voltage applied to the second conductive region (drain) 118. A vertical direction is a direction in which the semiconductor column 110 extends on a substrate. When the first conductivity type of the semiconductor column 110 is n-type, the semiconductor device 100a/100b operates as an n-channel semiconductor device and exhibits similar characteristics to an n-channel device of a MOSFET, except for hysteresis characteristic. In the case of the n-channel semiconductor device, the first conductive region 112 may function as a source and the second conductive region 118 may function as a drain.

The substrate may be a single-crystal silicon substrate, and the semiconductor column 110 may be polycrystalline or single-crystal silicon. The semiconductor column 110 may be doped on the substrate with impurities of the first or second conductivity type according to a vertical position. The first conductivity type may be n-type, and the second conductivity type may be p-type. The gate insulating layer 120 may be disposed to cover the intrinsic region 114 and may include silicon oxide. A $p^+$-$n^+$-i-$n^+$ structure includes a first p-n junction 111a, a second p-n junction 111b, and a third p-n junction 111c.

Referring to FIG. 1A, the semiconductor column 110 may be disposed to vertically extend on the substrate. The first conductivity type may be n-type, and the second conductivity type may be p-type. The first conductive region 112, the intrinsic region 114, the barrier region 116, and the second conductive region 118 may be sequentially disposed along the semiconductor column 110 as proceeding from a bottom surface to a top surface. The gate insulating layer 120 may be disposed to cover the intrinsic region 114, and the gate electrode 130 may be disposed on the intrinsic region 114 with the gate insulating layer 120 interposed therebetween to selectively cover only the intrinsic region 114.

Referring to FIG. 1B, the semiconductor column 110 may be disposed to vertically extend on the substrate. The first conductivity type may be n-type, and the second conductivity type may be p-type. The second conductive region 118, the barrier region 116, the intrinsic region 114, and the first conductive region 112 may be sequentially disposed along the semiconductor column 110 as proceeding from a bottom surface to a top surface. The gate insulating layer 120 may be disposed to cover the intrinsic region 114, and the gate electrode 130 may be disposed on the intrinsic region 114 with the gate insulating layer 120 interposed therebetween to selectively cover only the intrinsic region 114.

Figure 2A:
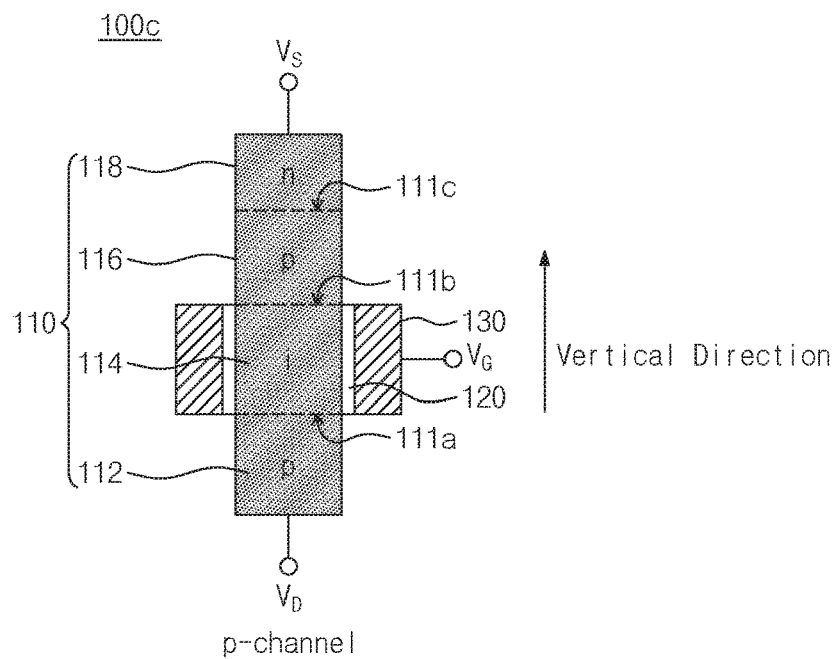
FIGS. 2A and 2B are conceptual diagrams of p-channel semiconductor devices according to an example embodiment of the present disclosure.
Figure 2B:
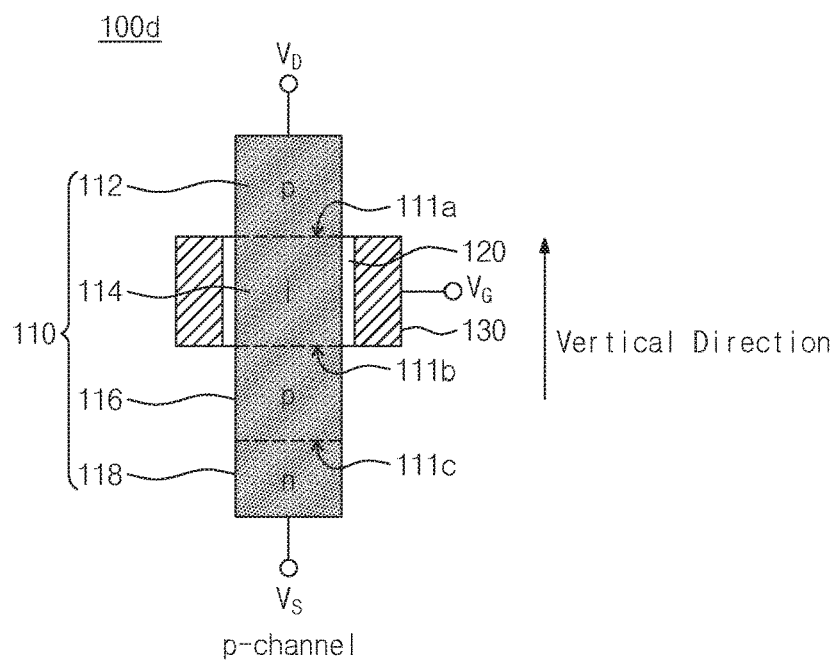

FIGS. 2A and 2B are conceptual diagrams of p-channel semiconductor devices according to an example embodiment of the present disclosure.

Figure 2C:
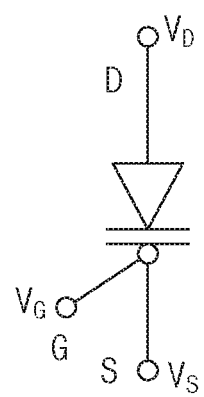
FIG. 2C is a symbol denoting the p-channel semiconductor device in FIGS. 2A and 2B.

FIG. 2C is a symbol denoting the p-channel semiconductor device in FIGS. 2A and 2B.

Referring to FIGS. 2A through 2C, a semiconductor device 100c/100d includes a semiconductor column 110 including a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114. The semiconductor device 100c/100d operates as a switch or a nonvolatile memory according to a gate voltage $V_{GS}$ applied to the gate electrode 130 or a drain voltage $V_{DS}$ applied to the first conductive region (drain) 112. A vertical direction is a direction in which the semiconductor column 110 extends on a substrate.

When the first conductivity type of the semiconductor column 110 is p-type, the semiconductor device 100c/100d operates as a p-channel semiconductor device and exhibits similar characteristics to an n-channel device of a MOSFET, except for hysteresis characteristic. In the case of the p-channel semiconductor device, the first conductive region 112 may function as a drain and the second conductive region 118 may function as a source.

The substrate may be a single-crystal silicon substrate, and the semiconductor column 110 may be polycrystalline or single-crystal silicon. The semiconductor column 110 may be doped on the substrate with impurities of the first or second conductivity type according to a vertical position. The first conductivity type may be n-type, and the second conductivity type may be p-type. The gate insulating layer 120 may be disposed to cover the intrinsic region 114 and may include silicon oxide. An $n^+$-$p^+$-$i$-$p^+$ structure includes a first p-n junction 111a, a second p-n junction 111b, and a third p-n junction 111c.

Referring to FIG. 2A, the semiconductor column 110 may be disposed to vertically extend on the substrate. The first conductivity type may be p-type, and the second conductivity type may be n-type. The first conductive region 112, the intrinsic region 114, the barrier region 116, and the second conductive region 118 may be sequentially disposed along the semiconductor column 110 as proceeding from a top surface to a top surface. The gate insulating layer 120 may be disposed to cover the intrinsic region 114, and the gate electrode 130 may be disposed on the intrinsic region 114 with the gate insulating layer 120 interposed therebetween to selectively cover only the intrinsic region 114.

Referring to FIG. 2B, the semiconductor column 110 may be disposed to vertically extend on the substrate. The first conductivity type may be p-type, and the second conductivity type may be n-type. The second conductive region 118, the barrier region 116, the intrinsic region 114, and the first conductive region 112 may be sequentially disposed along the semiconductor column 110 as proceeding from a bottom surface to a top surface. The gate insulating layer 120 may be disposed to cover the intrinsic region 114, and the gate electrode 130 may be disposed on the intrinsic region 114 with the gate insulating layer 120 interposed therebetween to selectively cover only the intrinsic region 114.

Figure 3:
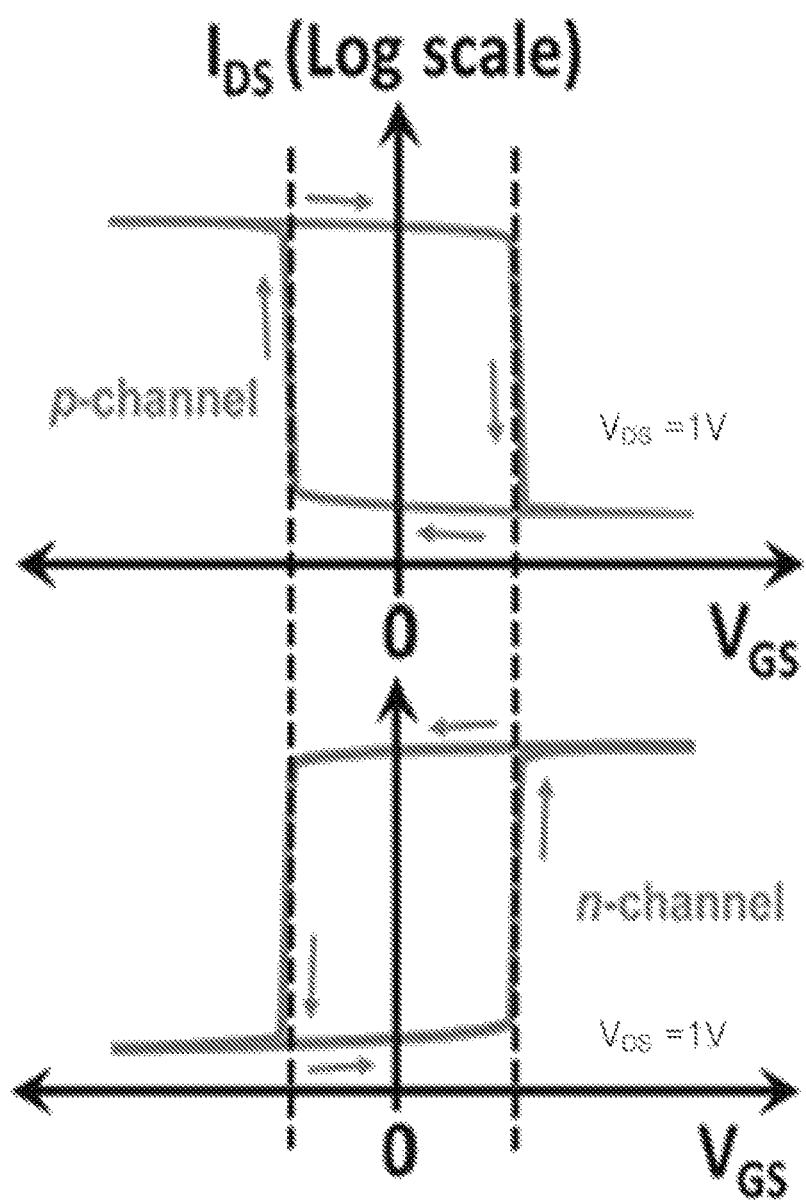
FIG. 3 illustrates an $I_{DS}$-$V_{GS}$ curve indicating drain current $I_{DS}$ depending on a gate voltage $V_{GS}$ of an n-channel semiconductor device and a p-channel semiconductor device according to an example embodiment of the present disclosure.

FIG. 3 illustrates an $I_{DS}$-$V_{GS}$ curve indicating drain current $I_{DS}$ depending on a gate voltage $V_{GS}$ of an n-channel semiconductor device and a p-channel semiconductor device according to an example embodiment of the present disclosure.

Referring to FIG. 3, an n-channel semiconductor device 100a/100b exhibits hysteresis characteristics at a positive drain voltage ($V_{DS}$=1V) according to the gate voltage $V_{GS}$ on the basis of 0V.

In addition, the p-channel semiconductor device 100c/100d exhibits hysteresis characteristics at a positive drain voltage ($V_{DS}$=1V) according to the gate voltage $V_{GS}$ on the basis of 0V.

If feedback semiconductor devices that are switchable memories are integrated, a memorable logical element may be implemented and a human's neuron may be functionally implemented. P-channel/n-channel feedback semiconductor devices are implemented such that hysteresis characteristics are all symmetrical at $I_{DS}$-$V_{GS}$ transfer curve on the basis of 0V. The n-channel feedback device 100a/100b may operate similarly to an n-channel MOSFET, and the p-channel feedback device 100c/100d may operate similarly to a p-channel MOSFET. Accordingly, the p-channel/n-channel feedback semiconductor device may be connected to each other to implement a logical integrated circuit such as NAND or NOR circuit. The logical integrated circuit can continue to memorize a result of logical operation even when an input voltage is not applied to a gate electrode after the logical operation. Thus, a neuron element for developing a low-power highly-integrated neuromorphic chip may be provided.

Figure 4A:
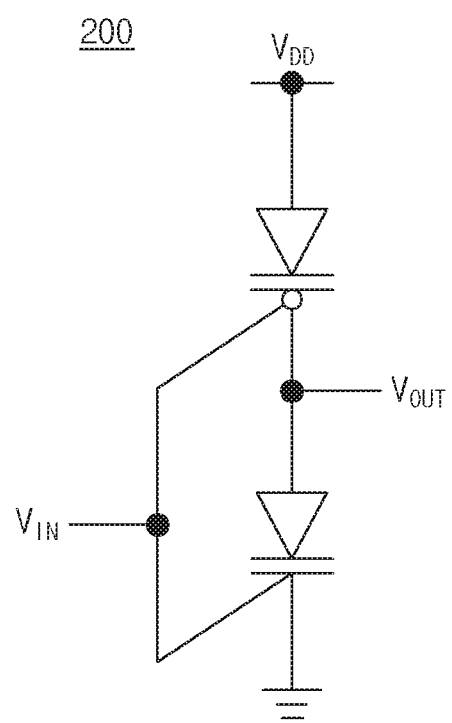
FIG. 4A is a symbol denoting a logic inverter according to an example embodiment of the present disclosure.

FIG. 4A is a symbol denoting a logic inverter according to an example embodiment of the present disclosure.

Figure 4B:
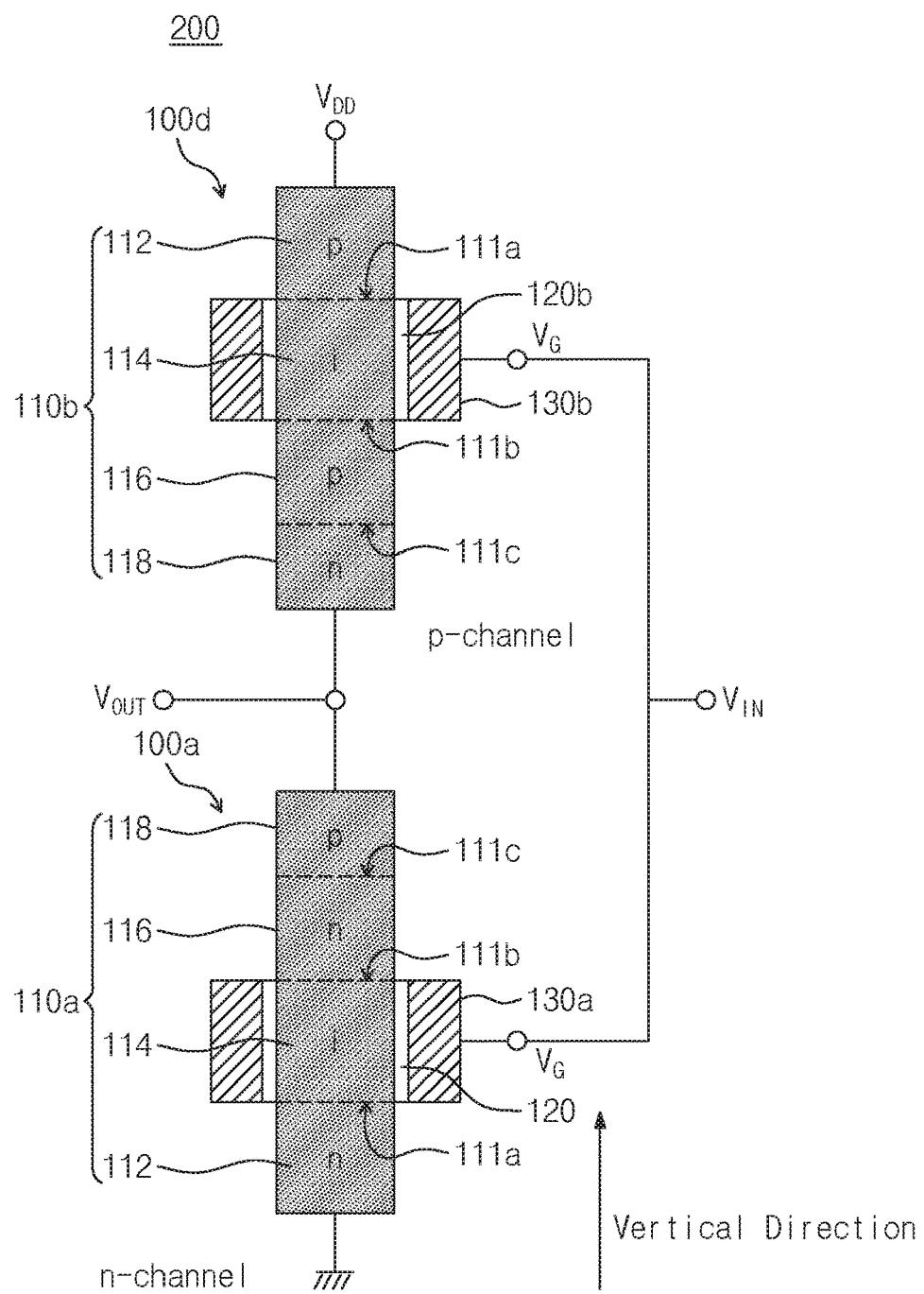
FIG. 4B is a structure diagram of the logic inverter in FIG. 4A.

FIG. 4B is a structure diagram of the logic inverter in FIG. 4A.

Figure 5:
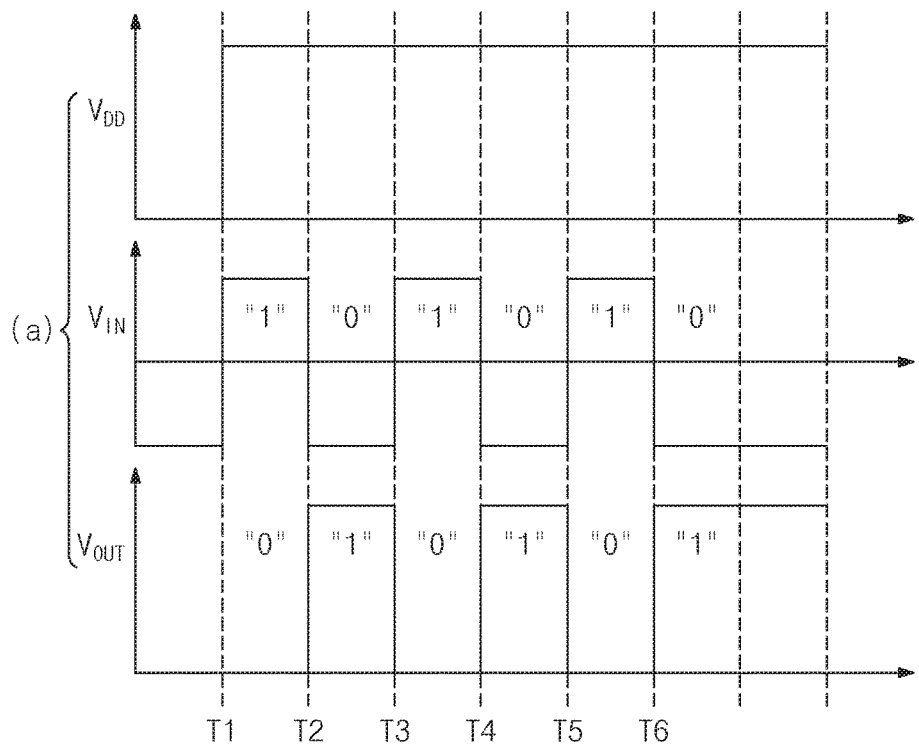
FIG. 5 is a timing diagram of the logic inverter in FIG. 4A.
Figure 5:
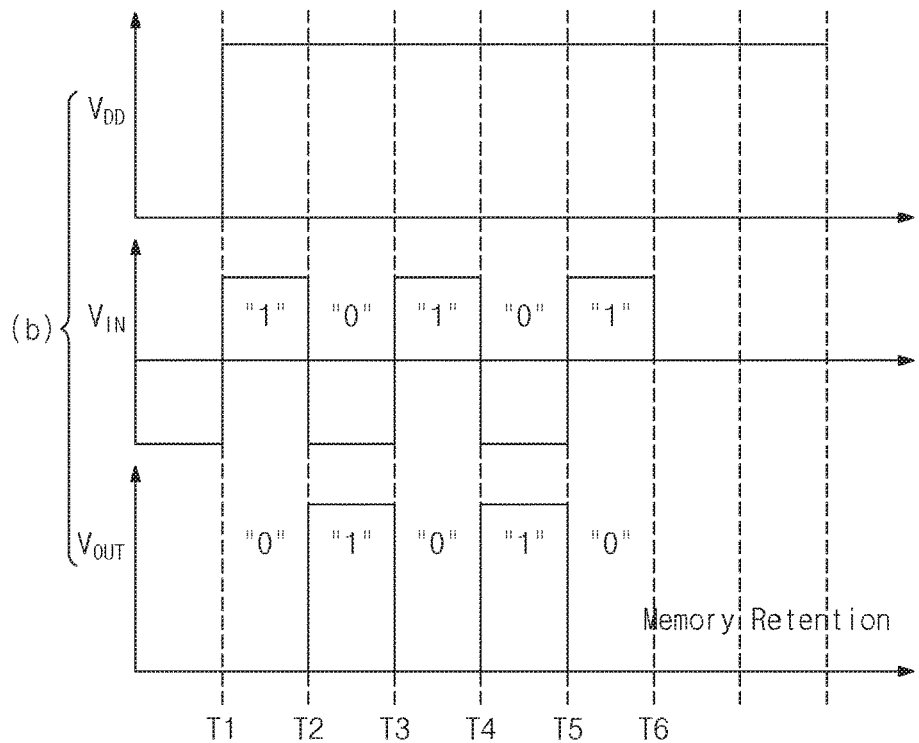

FIG. 5 is a timing diagram of the logic inverter in FIG. 4A.

Referring to FIGS. 4A and 4B and FIG. 5, a logic inverter semiconductor device 200 includes a plurality of stacked transistors 100a and 100d. Each of the transistors 100a and 100d includes a semiconductor column 110 including a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114.

The plurality of stacked transistors 100a and 100d include a first transistor 100a disposed at a lower portion and a second transistor 100d disposed above the first transistor 100a. A first conductivity type of the first transistor 100 may be n-type, and a first conductivity type of the second transistor 100d may be p-type. More specifically, the first transistor 100a may be an n-channel feedback semiconductor device, and the second transistor 100d may be a p-channel feedback semiconductor device.

The semiconductor column 110 of the first transistor 100a may include the first conductive region 112, the intrinsic region 114, the barrier region 116, and the second conductive region 118 which are sequentially disposed in a vertical direction. The semiconductor column 110 of the second transistor 100d may include the second conductive region 118, the barrier region 116, the intrinsic region 114, and the first conductive region 112 which are sequentially disposed in the vertical direction.

The gate electrode 130 of the first transistor 100a may be electrically connected to the gate electrode 130 of the second transistor 100d to receive an input signal VIN indicating logic "1" or "0". A logic "1" state may be a positive voltage, and a logic "0" state may be a negative voltage.

The second conductive region 118 of the first transistor 100a may be electrically connected to the second conductive region 118 of the second transistor 100d to provide an output signal $V_{OUT}$. The output signal VOUT may indicate a logic "0" state and a logic "1" state.

The first conductive region 112 of the first transistor 100a may be grounded, and the first conductive region 118 of the second transistor 100d may be connected to an applied voltage $V_{DD}$. The first transistor 100a and the second transistor 100d may provide a logic inverter 200, and the input signal $V_{IN}$ and the output signal $V_{OUT}$ may be in opposite states.

In the logic inverter 200, when the input signal $V_{IN}$ is not provided or is grounded, the output signal $V_{OUT}$ may memorize and output a result of a previous state. For example, when the input signal $V_{IN}$ is a ground signal that does not indicate logic "1" or "0" at a time T6, the output signal $V_{OUT}$ may retain data (logic "0" state) memorized in a previous period (T5-T6). That is, the logic inverter 200 may retain an output signal of the previous state even when the input signal $V_{IN}$ is removed.

Figure 6A:
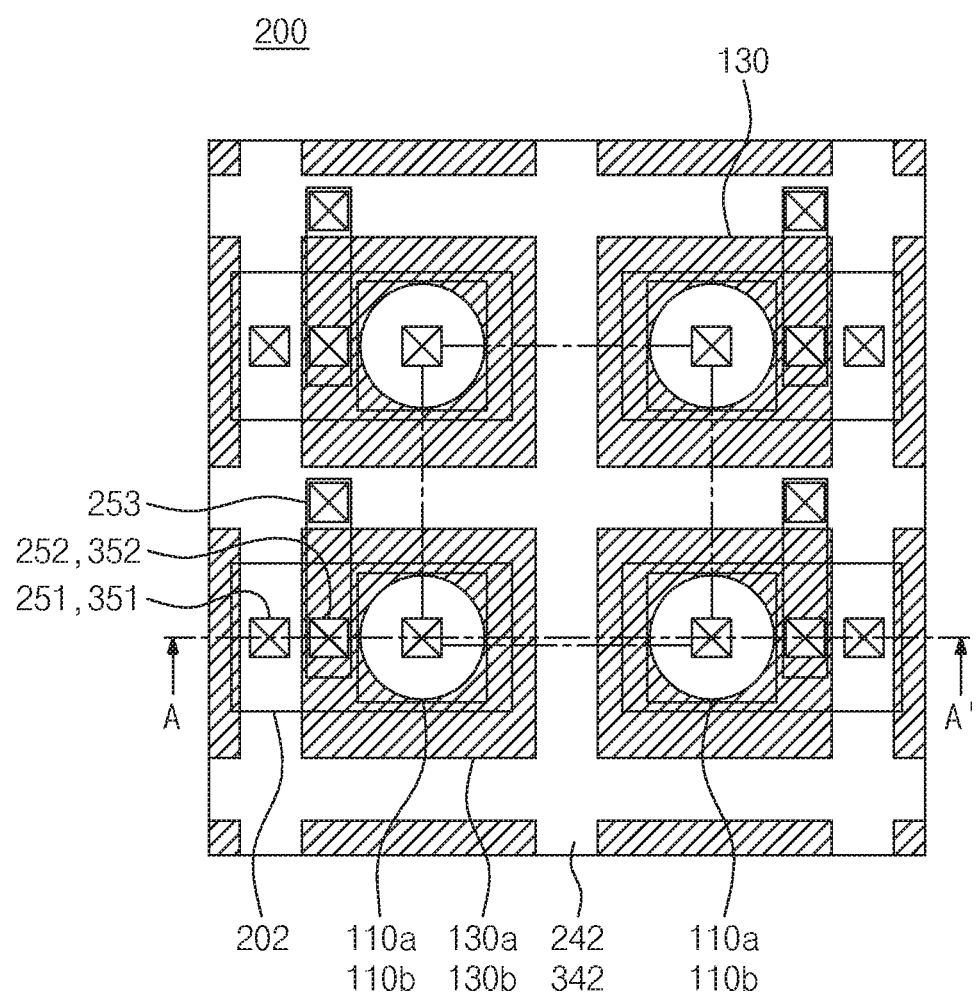
FIG. 6A is a top plan view of the logic inverter in FIG. 4B.

FIG. 6A is a top plan view of the logic inverter in FIG. 4B.

Figure 6B:
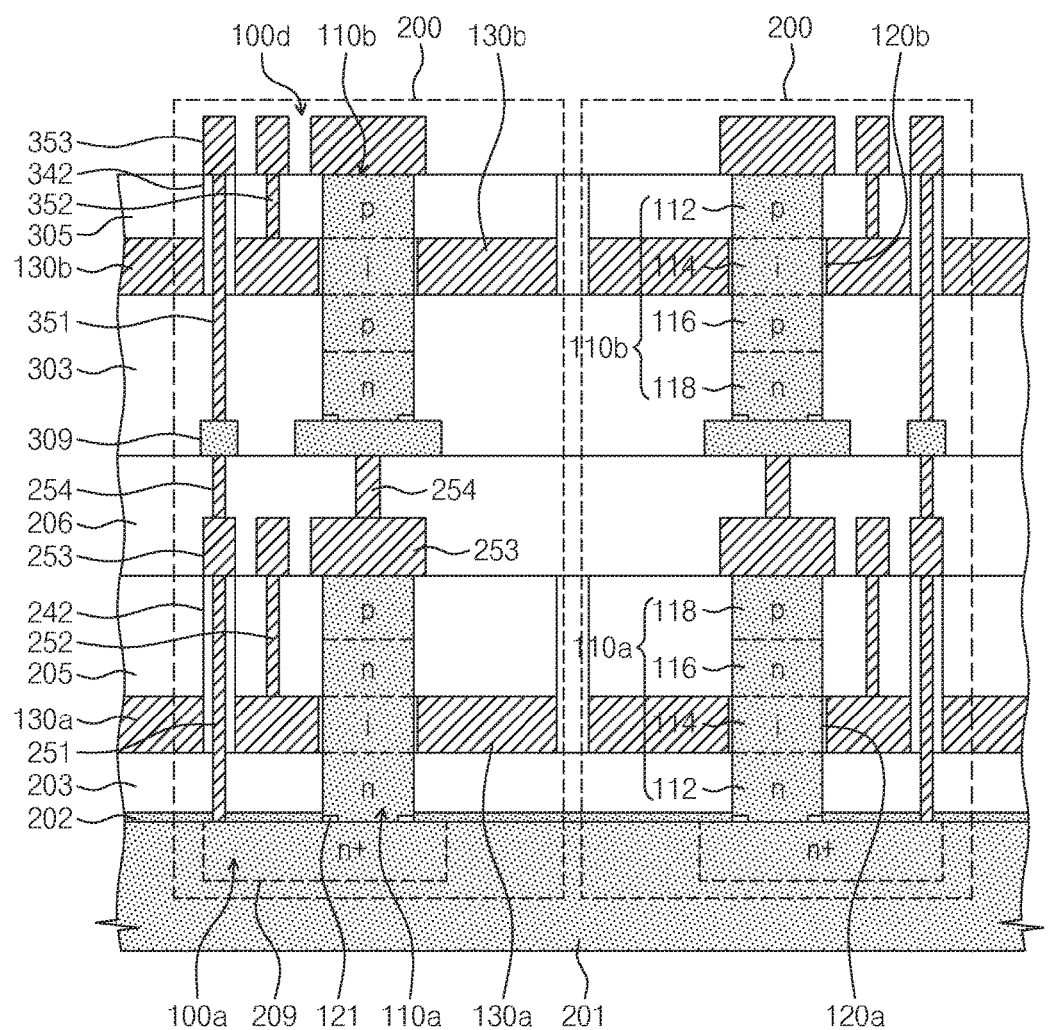
FIG. 6B is a cross-sectional view taken along the line A-A' of the logic inverter in FIG. 6A.

FIG. 6B is a cross-sectional view taken along the line A-A' of the logic inverter in FIG. 6A.

Referring to FIG. 4B and FIGS. 6A and 6B, a logic semiconductor device 200 includes a plurality of stacked transistors 100a and 100d. The transistors 100a/100d includes semiconductor columns 100a/100b including a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118; gate electrodes 130a/130b disposed to cover the intrinsic region 114, and gate insulating layers 120a/120b disposed between the gate electrode 130a/130b and the intrinsic region 114, respectively.

The plurality of stacked transistors 100a and 110d include a first transistor 100a disposed at a lower portion and a second transistor disposed above the first transistor 100a. First conductivity type of the first transistor 100a may be n-type, and first conductivity type of the second transistor 100d may be p-type. More specifically, the first transistor 100a may be an n-channel feedback semiconductor device and the second transistor 100d may be a p-channel feedback semiconductor device.

The lower semiconductor column 110a of the first transistor 100a may include the first conductive region 112, the intrinsic region 114, the barrier region 116, and the second region 118 that are sequentially disposed in a vertical direction. The upper semiconductor column 110b of the second transistor 100d may include the second conductive region 118, the barrier region 116, the intrinsic region 114, and the first conductive region 112 that are sequentially disposed in the vertical region.

The transistors 100a and 100d may include a first transistor 100a disposed at a lower layer and a second transistor 100d disposed at an upper layer.

The first transistor 100a includes a lower interlayer dielectric 203 disposed on a substrate 201; a second lower interlayer dielectric 205 disposed on the first lower interlayer dielectric 203; a lower gate electrode 130a disposed between the first lower interlayer dielectric 203 and the second lower interlayer dielectric 205; a lower semiconductor column 130a disposed through the second lower interlayer dielectric 205, the lower gate electrode 130a, and the first lower interlayer dielectric 203; a lower gate insulating layer 120a disposed between the lower semiconductor column 110a and the lower gate electrode 130; a lower interconnection 253 disposed on the lower semiconductor column 110; and a third lower interlayer dielectric 206 disposed on the lower interconnection 253.

The substrate 201 may be a silicon semiconductor substrate. A lower auxiliary interconnection 209 may be formed on the substrate 201. The lower auxiliary interconnection 209 may be in contact with the first conductive region 112 of the lower semiconductor column 110a and may be silicon heavily doped with impurities of first conductivity type to be electrically connected. The lower auxiliary interconnection 209 may be formed by defining an active region using a shallow trench isolation (STI) process and doping the active region with the impurities of the first conductivity type. The first conductivity type may be n-type, and the second conductivity type may be p-type.

According to a modified embodiment of the present disclosure, the lower auxiliary interconnection 209 may be disposed on an insulating layer and may be formed of a silicon pattern doped with impurities of the first conductivity type.

The first lower interlayer dielectric 203 may be disposed on the substrate 201. The first lower interlayer dielectric 203 may include silicon oxide. An etch-stop layer 202 may be disposed between the first lower interlayer dielectric 203 and the substrate 201. The etch-stop layer 202 may include silicon nitride.

A lower gate electrode 130a may be disposed on the first lower interlayer dielectric 203. The lower gate electrode 130a may include doped polysilicon. The lower gate electrode 130a may be in the form of an island-shaped plate.

A second lower interlayer dielectric 205 may be disposed on the lower gate electrode 130a. The second lower interlayer dielectric 205 may include silicon oxide.

The lower semiconductor column 110a may be disposed through the second lower interlayer dielectric 205, the lower gate electrode 130a, the first lower interlayer dielectric 203, and the etch-stop layer 202. The lower semiconductor column 110a may extend vertically on the substrate 201. The lower semiconductor column 110a may be a silicon column having a doped region varying depending on a position. A bottom surface of the lower semiconductor column 110a may be connected to the lower auxiliary interconnection 209, and a top surface thereof may be connected to the lower interconnection 253.

The lower gate insulating layer 120a may cover the intrinsic region 114 of the lower semiconductor column 110a and may be disposed between the lower semiconductor column 110a and the lower gate electrode 130a. The lower gate insulating layer 120a may include silicon oxide. The lower gate insulating layer 120a may be formed by thermally oxidizing the lower gate electrode 130a.

The lower interconnection 253 may be disposed on the second lower interlayer dielectric 205 and the lower semiconductor column 110a. The lower interconnection 253 may include doped polysilicon, metal, metal alloy or silicide.

The third lower interlayer dielectric 206 may be disposed on the lower interconnection 253 and the second interlayer dielectric 205. The third lower interlayer dielectric 206 may include silicon oxide.

A lower gate isolation layer 242 may isolate the lower gate electrode 130a and may be disposed to cover the lower gate electrode 130a. The lower gate isolation layer 242 may fill the periphery of the lower gate electrode 130a and may fill the isolated second lower interlayer dielectric 205.

A lower auxiliary interconnection contact plug 251 may be connected to the lower auxiliary interconnection 209 through the lower gate isolation layer 242 and the first lower interlayer dielectric 203. The lower auxiliary interconnection contact plug 215 may include at least one of metal, metal alloy, and silicide. The lower auxiliary interconnection contact plug 251 may be connected to the lower interconnection 253.

The lower gate contact plug 252 may be disposed in contact with the lower gate electrode 130a through the second lower interlayer dielectric 205. The lower gate contact plug 252 may include at least one of metal, metal alloy, and silicide.

A lower via plug 254 may be connected to the lower interconnection 253 through the third interlayer dielectric 206. The lower via plug 254 may include at one of metal, metal alloy, and silicide.

The second transistor 100d may include a first upper interlayer dielectric 303 disposed on the third lower interlayer dielectric 206; a second upper interlayer dielectric 305 disposed on the first upper interlayer dielectric 303; an upper gate electrode 130b disposed between the first upper interlayer dielectric 303 and the second upper interlayer dielectric 305; an upper semiconductor column 110b disposed through the second upper interlayer dielectric 305, the upper gate electrode 130b, and the first upper interlayer dielectric 303; an upper gate insulating layer 120b disposed between the upper semiconductor column 110b and the upper gate electrode 130b; and an upper interconnection 353 disposed on the second upper interlayer dielectric 305 and the upper semiconductor column 110b.

The upper semiconductor column 110b may include a second conductive region of second conductivity type, a barrier region 116 of first conductivity type, an intrinsic region 114, and a first conductive region 112 of the first conductivity type which are sequentially staked in a vertical direction. The upper semiconductor column 110b may provide a p-channel feedback semiconductor device. The first conductivity type of the second transistor 100d may be p-type, and the second conductivity type thereof may be n-type.

An upper auxiliary interconnection 309 may be formed on the substrate 201 or the third lower interlayer dielectric 206. The upper auxiliary interconnection 309 may be in contact with the second conductive region 118 of the upper semiconductor column 110 and may include silicon heavily doped with impurities of the second conductivity type to be electrically connected. The upper auxiliary interconnection 309 may be disposed on the third lower insulating layer 206 and may be formed of a silicon pattern doped with impurities of the second conductivity type.

The first upper interlayer dielectric 302 may be disposed on the upper auxiliary interconnection 309. The first upper interlayer dielectric 303 may include silicon oxide.

An upper gate electrode 130b may be disposed on the first upper interlayer dielectric 303. The upper gate electrode 130b may include doped polysilicon. The upper gate electrode 130b may be in the form of an island-shaped plate.

A second upper interlayer dielectric 305 may be disposed on the upper gate electrode 130b. The second upper interlayer dielectric 305 may include silicon oxide.

The upper semiconductor column 110b may be disposed through the second upper interlayer dielectric 305, the upper gate electrode 130b, and the first upper interlayer dielectric 303. The upper semiconductor column 110b may extend vertically on the substrate 201. The upper semiconductor column 110b may be a silicon column having a doped region varying depending on a position. A bottom surface of the upper semiconductor column 110b may be connected to the upper auxiliary interconnection 309, and a top surface thereof may be connected to the upper interconnection 353.

The upper gate insulating layer 120b may cover the intrinsic region of the upper semiconductor column 110b and may be disposed between the upper semiconductor column 110b and the upper gate electrode 130b. The upper gate insulating layer 120b may include silicon oxide. The upper gate insulating layer 120b may be formed by thermally oxidizing the upper gate electrode 130b.

The upper interconnection 353 may be disposed on the second upper interlayer dielectric 305 and the upper semiconductor column 110b. The upper interconnection 353 may include doped polysilicon, metal, metal alloy or silicide.

An upper gate isolation layer 342 may isolate the upper gate electrode 130b and may be disposed to cover the upper gate electrode 130b. The upper gate isolation layer 342 may fill the periphery of the upper gate electrode 130b and fill the isolated second upper interlayer dielectric 305.

An upper auxiliary interconnection contact plug 351 may be connected to the upper auxiliary interconnection 309 through the upper gate isolation layer 342 and the first upper interlayer dielectric 303. The upper auxiliary interconnection contact plug 351 may include at least one of metal, metal alloy, and silicide. The upper auxiliary interconnection contact plug 351 may be connected to the upper interconnection 353.

An upper gate contact plug 352 may be disposed in contact with the upper gate electrode 130b through the second upper interlayer dielectric 305. The upper gate contact plug 352 may be connected to the upper interconnection 353. The upper gate contact plug 352 may include at least one of metal, metal alloy, and silicide.

FIGS. 7A through 7L are conceptual diagrams illustrating a method for fabricating a semiconductor device according to an example embodiment of the present disclosure.

Figure 7A:
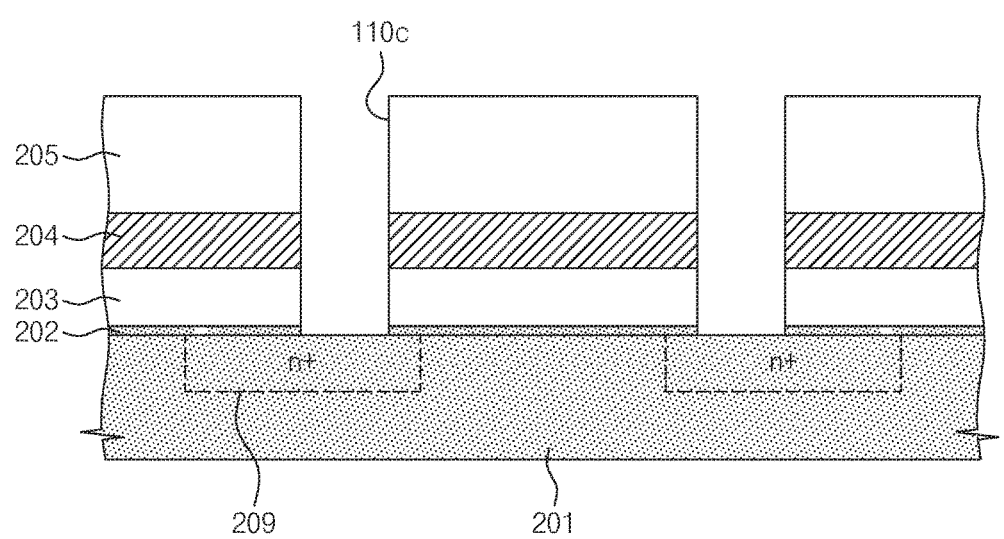
FIGS. 7A through 7L are conceptual diagrams illustrating a method for fabricating a semiconductor device according to an example embodiment of the present disclosure.

Referring to FIG. 7A, an auxiliary lower interconnection 209 may be formed on a substrate 201. The auxiliary lower interconnection 209 may be formed on the substrate 209 by an ion implantation process using a mask. The lower auxiliary interconnection 209 may be in contact with a first conductive region of a lower semiconductor column 110b and may include silicon heavily doped with impurities of first conductivity type (e.g., n-type impurities) for electrical interconnection.

An etch-stop layer 202, a first lower interlayer dielectric 203, a lower gate electrode layer 204, a second lower interlayer dielectric 205 may be sequentially formed on the substrate 201 where the lower auxiliary interconnection 209 is formed. The etch-stop layer 202 may include silicon nitride, and the first lower interlayer dielectric and the second lower interlayer dielectric 205 may include silicon oxide. The lower gate electrode 204 may be patterned later to form a lower gate electrode 130a. A thickness of the second interlayer dielectric 205 may be greater than that of the first lower interlayer dielectric 203 or the lower gate electrode layer 204.

The second lower interlayer dielectric 205, the lower gate electrode layer 204, the first interlayer dielectric 203, and the etch-stop layer 202 may successively patterned using a patterning process to form a through-hole 110c.

Figure 7B:
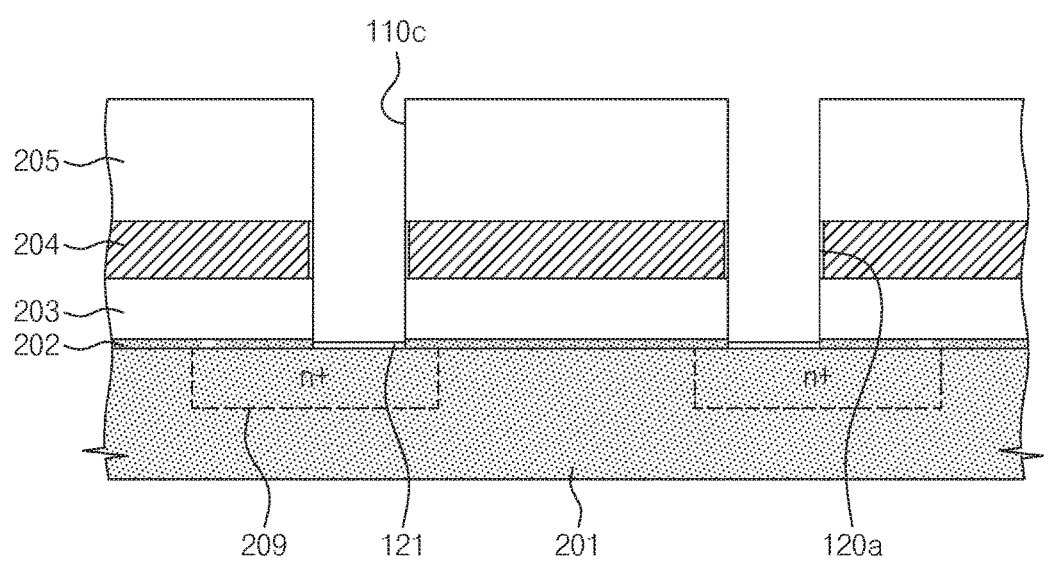

Referring to FIG. 7B, a lower gate insulating layer 120a may be formed at an exposed lower gate electrode layer 204 in the through-hole 110c. The lower gate insulating layer 20a may include silicon oxide formed by a thermal oxidation process. When the lower gate insulating layer 120b is formed, a lower auxiliary insulating layer 121 may be formed on the exposed auxiliary lower interconnection 209.

Figure 7C:
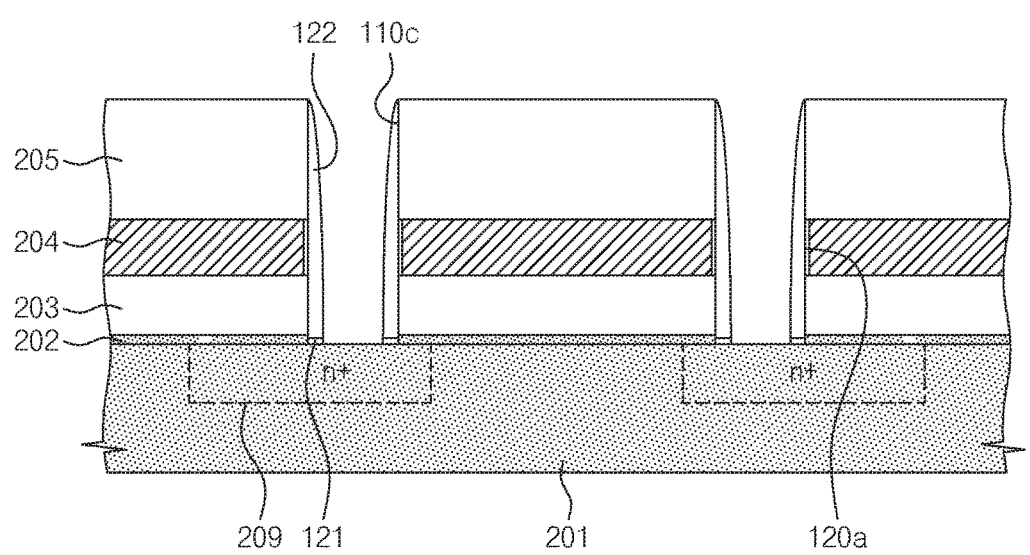

Referring to FIG. 7C, a lower sidewall protection layer may be deposited on the substrate 201 where the lower gate insulating layer 121 is formed. The lower sidewall protection layer may be anisotropically etched to form a lower sidewall 122. The lower auxiliary insulating layer 121 may be etched using the lower sidewall 122 as a mask to expose the auxiliary lower interconnection.

Figure 7D:
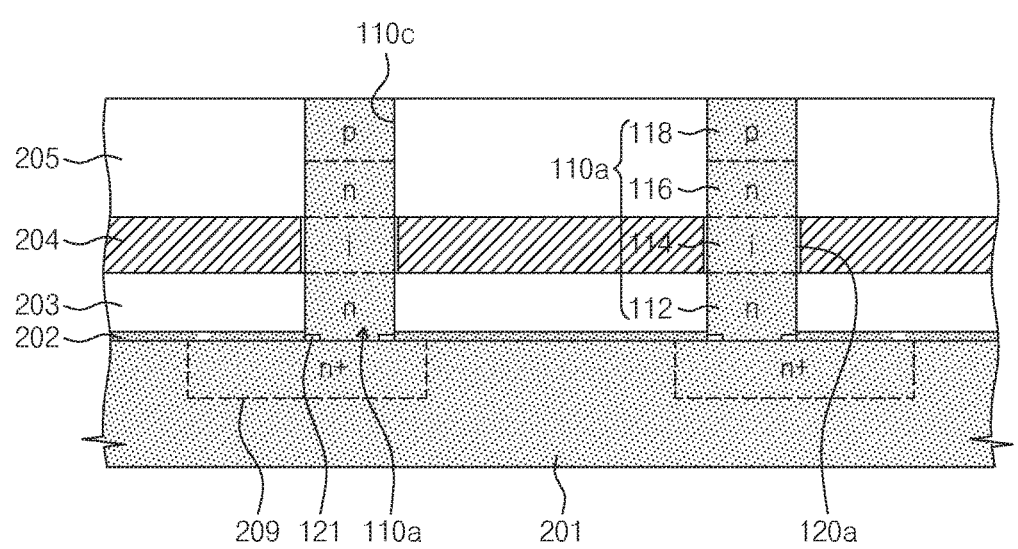

Referring to FIG. 7D, the lower sidewall 122 may be selectively removed by wet etching. A lower semiconductor column 110a may be formed in the through-hole 110c. The lower semiconductor column 110a may be formed by selective epitaxial growth or chemical vapor deposition (CVD). When the CVD is used, polysilicon may fill the through-hole 110c and then be annealed to be single-crystallized. A top surface of the lower semiconductor column 110a may be planarized by a planarization process. When the selective epitaxial growth is used, impurity doping may be performed simultaneously with growth of the lower semiconductor column 110a. In addition, impurity doping of the lower semiconductor column 110a may be performed by an ion implantation process. Thus, the lower semiconductor column 110a may include a first conductive region 112 of first conductivity type, an intrinsic region 114, a barrier layer 116 of the first conductivity type, and a second conductive region 118 of the second conductivity type which are sequentially disposed to be perpendicular to the substrate 201. The intrinsic region 114 may be aligned with the lower gate electrode layer 204.

Figure 7E:
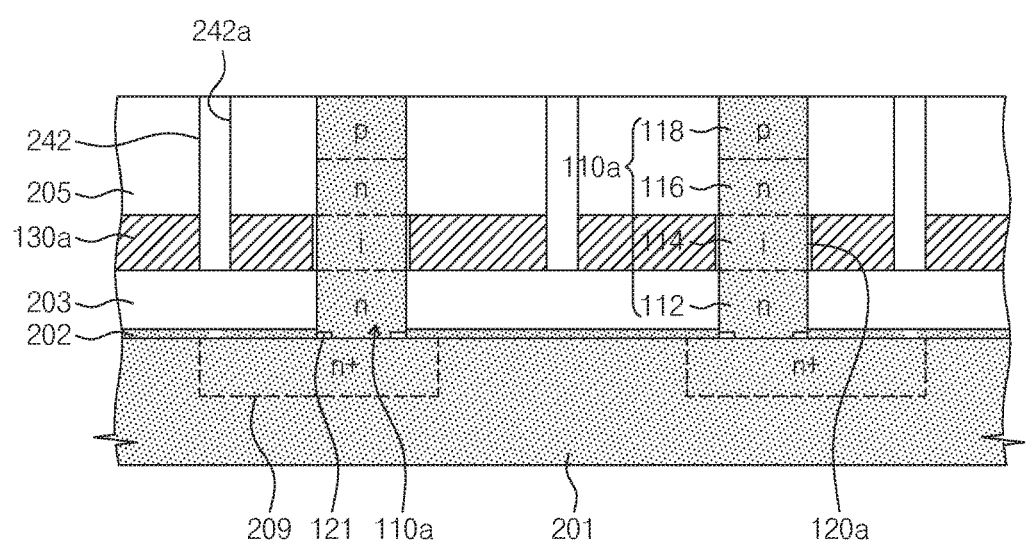

Referring to FIG. 7E, the second lower interlayer dielectric 205 and the lower gate electrode layer 204 may be etched using a patterning process to form a trench 242a such that the lower gate electrode layer 204 is isolated to form the lower gate electrode 130a. Thus, the lower gate electrode layer 204 may be isolated in the form of an island to form the lower gate electrode 130a. A lower gate isolation layer 242 may be deposited to fill the trench 242a. The lower gate isolation layer 242 may include silicon oxide. A top surface of the lower semiconductor column 110a may be exposed by planarizing the substrate 201 where the lower gate isolation layer 242 is formed.

Figure 7F:
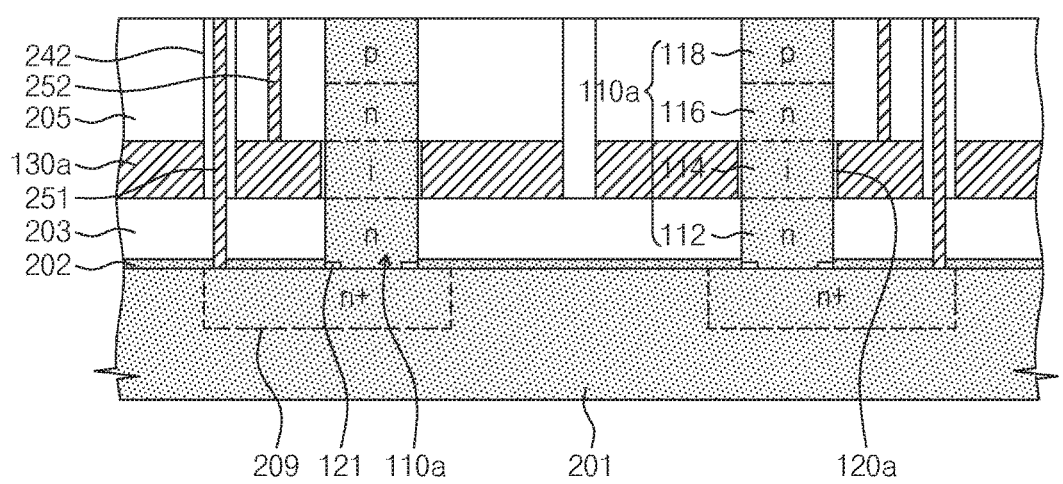

Referring to FIG. 7F, a lower gate contact hole may be formed using a patterning process to electrically connect the lower gate electrode 130a. In addition, a lower auxiliary interconnect contact hole may be formed to electrically connect the lower auxiliary interconnection. The lower gate contact hole and the lower auxiliary interconnection contact hole may be formed at the same time. A lower gate contact plug 252 may be formed of a conductive material to fill the lower gate contact hole. The lower auxiliary interconnection contact plug 251 may fill the lower auxiliary interconnection contact hole. The lower auxiliary interconnection contact plug 251 and the lower gate contact plug 252 may include at least one of metal, metal alloy, and silicide.

Figure 7G:
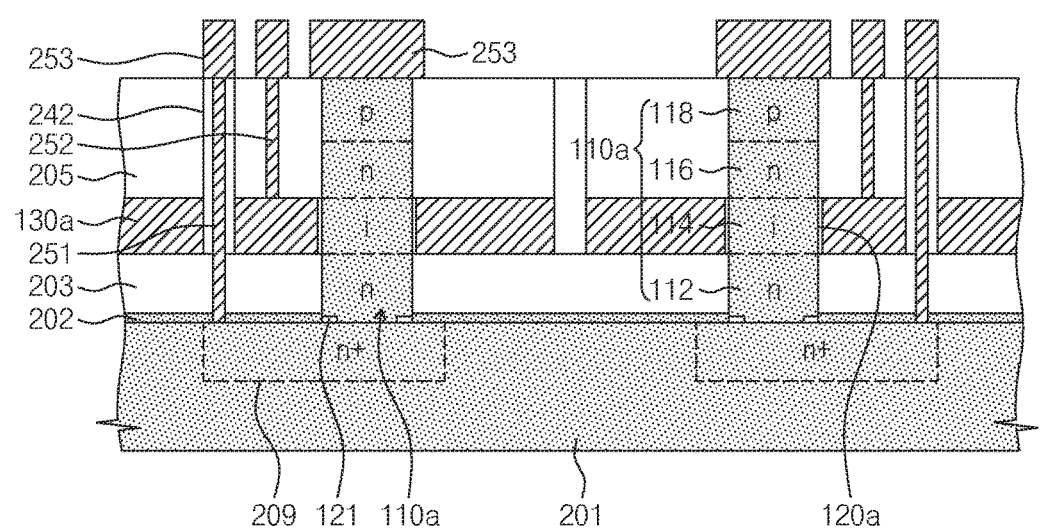

Referring to FIG. 7G, a lower interconnection 253 may be formed on each of the lower auxiliary interconnection contact plug 251, the lower gate contact plug 252, and the lower semiconductor column 110. The lower interconnection 253 may extend on the same plane to be electrically connected.

Figure 7H:
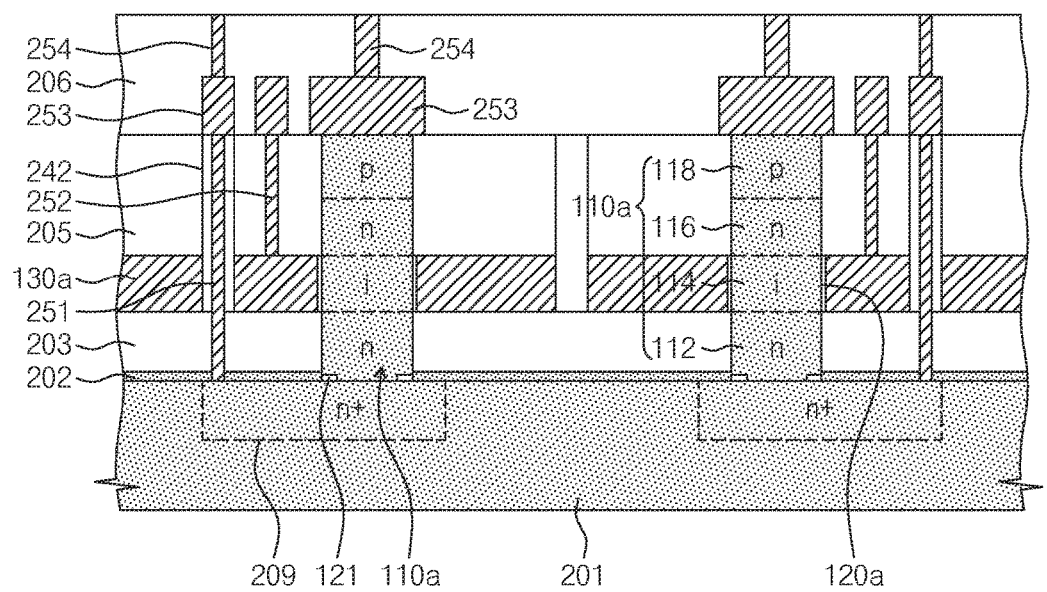

Referring to FIG. 7H, a third lower interconnection dielectric 206 may be disposed on the substrate 201 where the lower interconnection 253 is formed. A lower via plug 254 may be connected to the lower interconnection 253 through the third interlayer dielectric 206. The lower via plug 254 may include at least one of metal, metal alloy, and silicide.

Figure 7I:
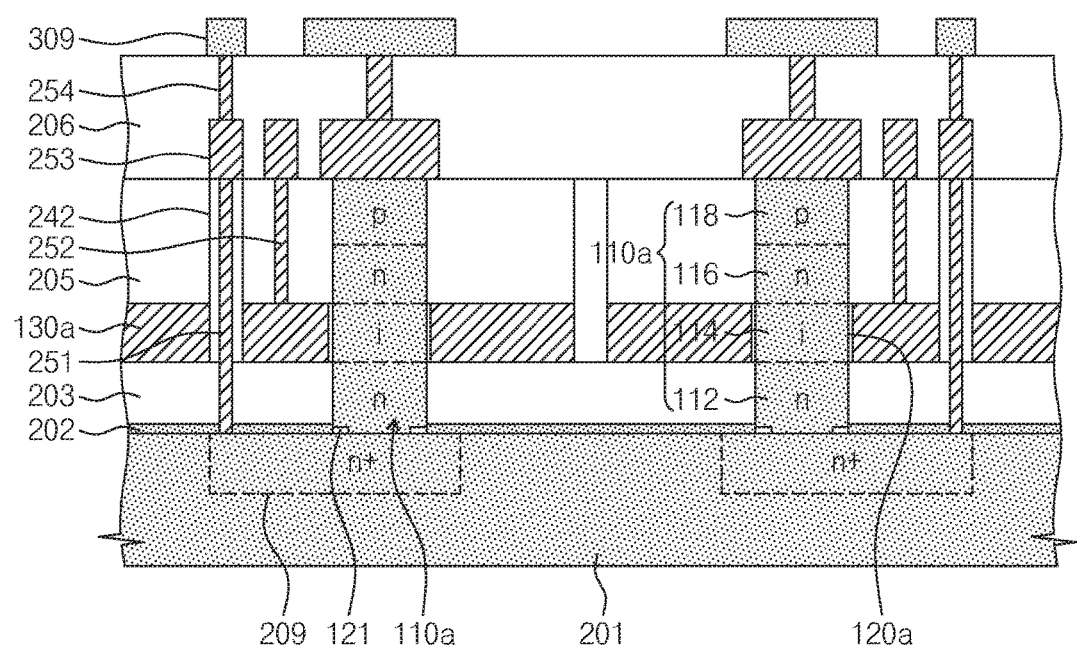

Referring to FIG. 7I, an auxiliary upper interconnection 309 may be formed on the third interlayer dielectric 206. The auxiliary upper interconnection 309 may provide a seed for formation of the upper semiconductor column 110 and act as a pad for a contact plug which will be formed later. The auxiliary upper interconnection 309 may be connected to the lower via plug 254.

The auxiliary upper interconnection 309 may include doped silicon. A conductivity type of the auxiliary upper interconnection 309 may be the same as a conductivity type of a bottom surface of the upper semiconductor column 110a.

Figure 7J:
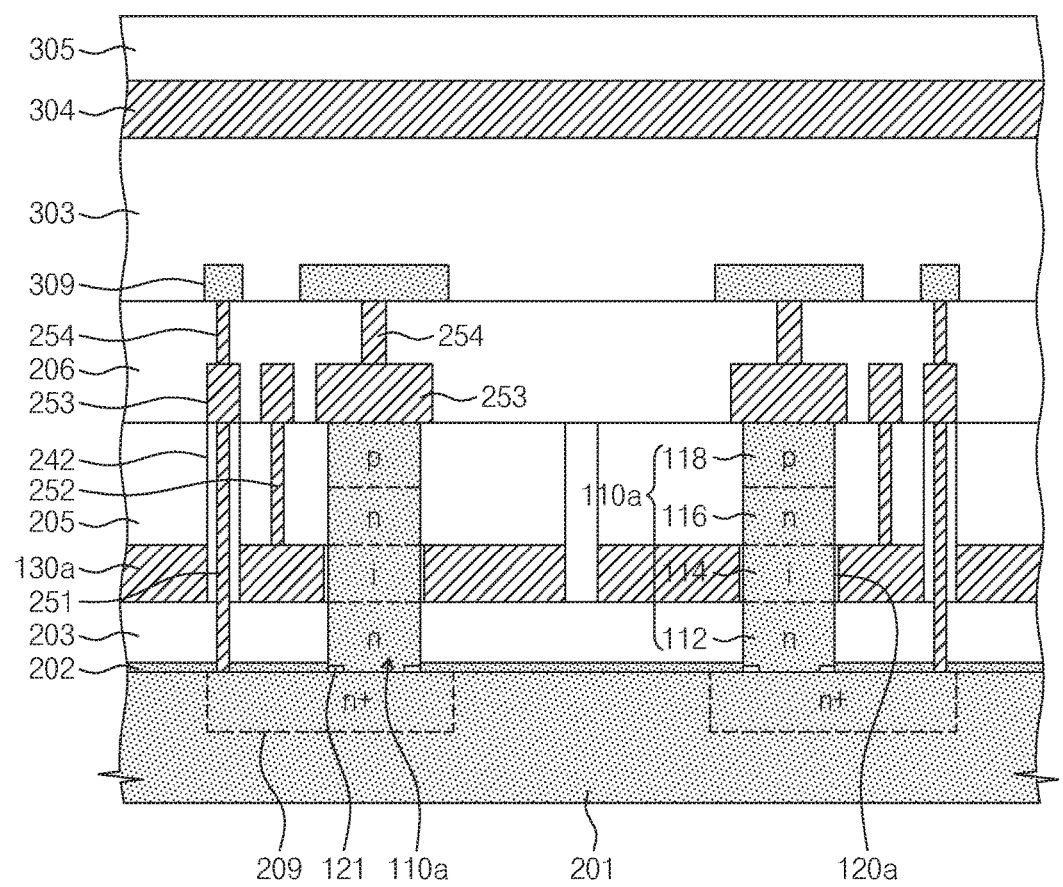

Referring to FIG. 7J, a first upper interlayer dielectric 303, an upper gate electrode layer 304, and a second upper interlayer dielectric 305 may be sequentially formed on the third lower interlayer dielectric 206 and the auxiliary upper interconnection 309. The first upper interlayer dielectric 303 and the second upper interlayer dielectric 305 may include silicon oxide, and the upper gate electrode layer 304 may include doped polysilicon. A thickness of the first upper interlayer dielectric 303 may be greater than that of the second interlayer dielectric 305 or the upper gate electrode layer 304.

Figure 7K:
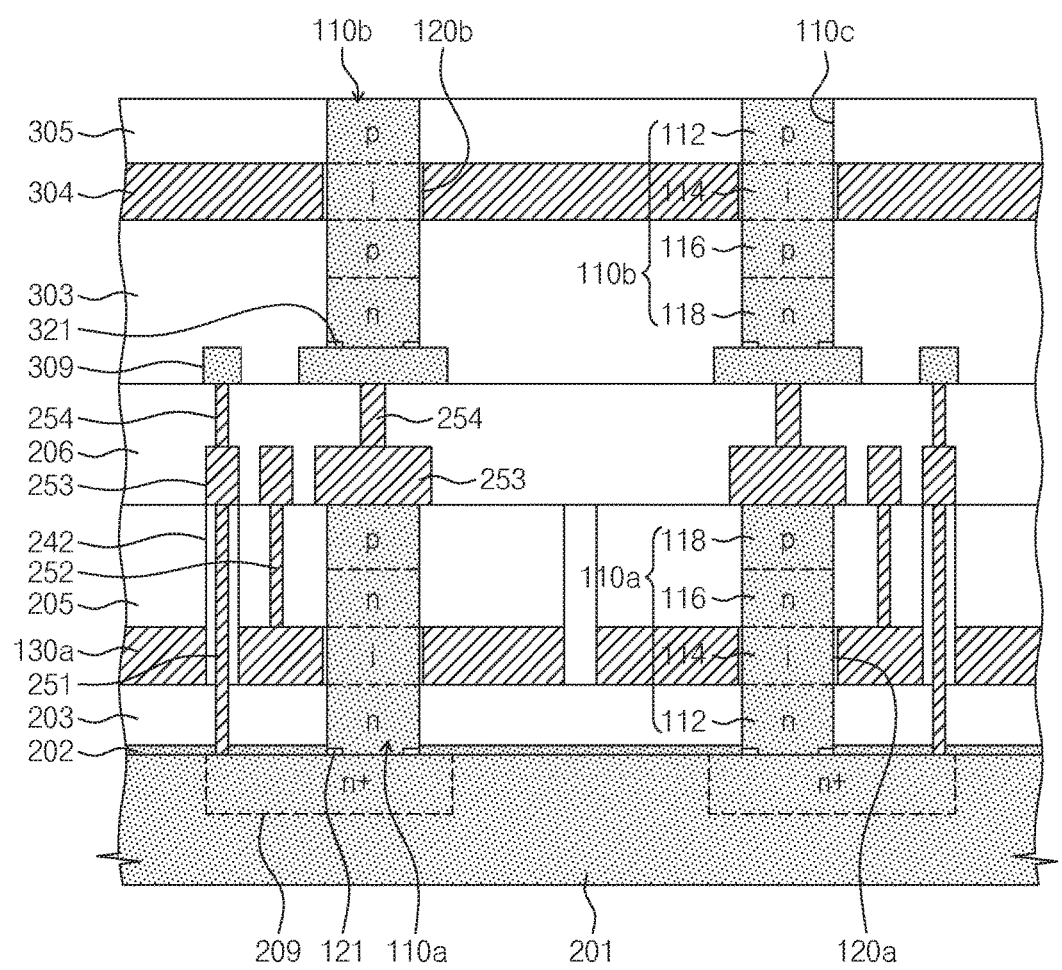

Referring to FIG. 7K, the second upper interlayer dielectric 305, the upper gate electrode layer 304, and the first upper interlayer dielectric 303 may be successively patterned using a patterning process to form a through-hole 110c. An upper gate insulating layer 120b may be formed at an exposed upper gate electrode layer 304 in the through-hole 110c. The upper gate insulating layer 120b may include silicon oxide formed by a thermal oxidation process. When the upper gate insulating layer 120b is formed, an upper auxiliary insulating layer may be formed on the exposed auxiliary upper interconnection 309.

An upper sidewall protection layer may be deposited on the substrate 201 where the upper gate insulating layer 120b is formed. The upper sidewall protection layer may be anisotropically etched to form an upper sidewall. The upper auxiliary insulating layer 321 may be etched using the upper sidewall as a mask to expose the auxiliary upper interconnection.

The upper sidewall may be selectively removed by wet etching. An upper semiconductor column 110b may be formed in the through-hole 110c. The upper semiconductor column 110b may be formed by selective epitaxial growth or chemical vapor deposition (CVD). When the CVD is used, polysilicon may fill the through-hole 110c and then be annealed to be single-crystallized. A top surface of the upper semiconductor column 110b may be planarized by a planarization process. When the selective epitaxial growth is used, impurity doping may be performed simultaneously with growth of the upper semiconductor column 110b. In addition, impurity doping of the upper semiconductor column 110b may be performed by an ion implantation process. Thus, the upper semiconductor column 110b may include a second conductive region 118 of second conductivity type, a barrier region 116 of first conductivity type, an intrinsic region 114, and a first conductive region 112 of the first conductivity type which are sequentially disposed to be perpendicular to the substrate 201. The intrinsic region 114 may be aligned with the upper gate electrode layer 304. The first conductivity type may be p-type, and the second conductivity type may be n-type.

Figure 7L:
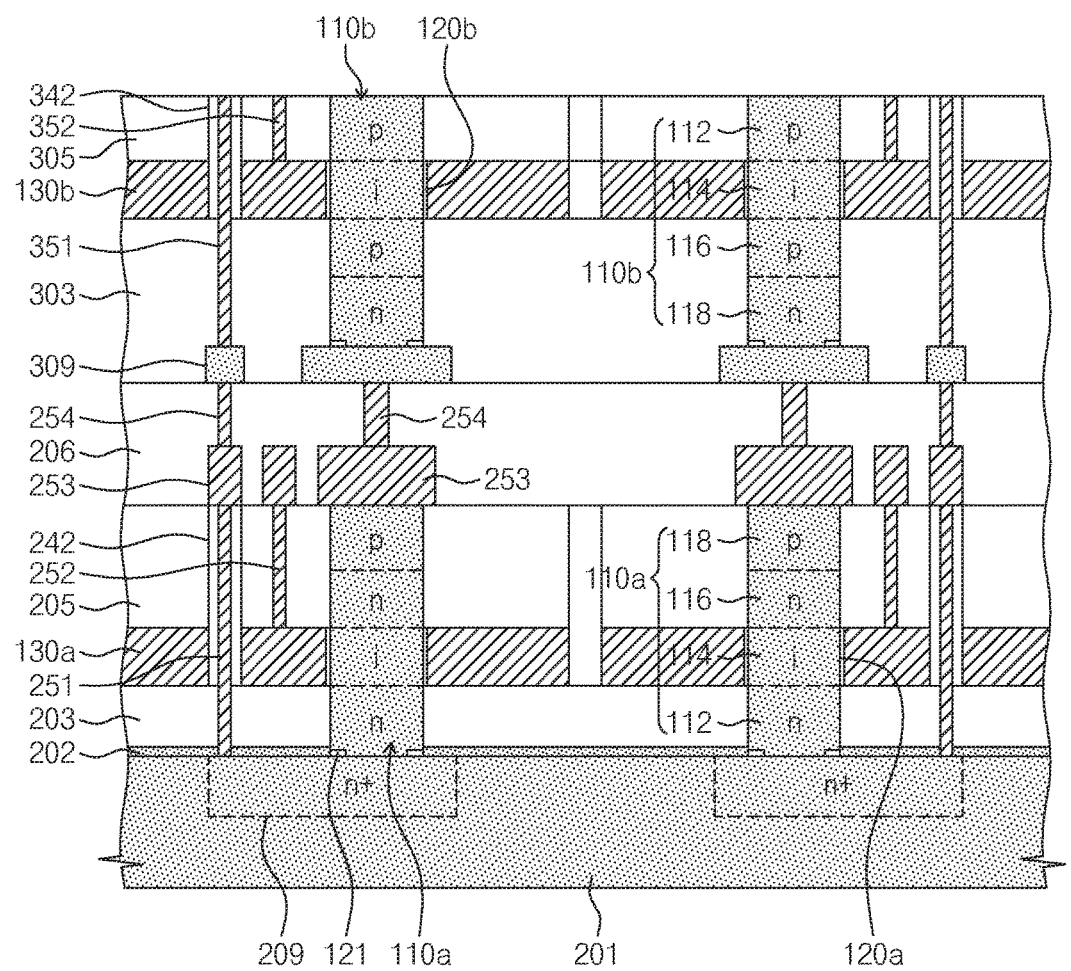

Referring to FIG. 7L, the second upper interlayer dielectric 305 and the upper gate electrode layer 304 may be etched using a patterning process to form a trench such that the upper gate electrode layer 304 is isolated to form an upper gate electrode 130b. Thus, the upper gate electrode layer 304 may be isolated in the form of an island o form an upper gate electrode 130b. An upper gate isolation layer 342 may be deposited to fill the trench. The upper gate isolation layer 342 may include silicon oxide. A top surface of the semiconductor column 110b may be exposed by planarizing the substrate 201 where the upper gate isolation layer 342 is formed.

An upper gate contact hole may be formed using a patterning process to electrically connect the upper gate electrode 130b. In addition, an upper auxiliary interconnection contact hole may be formed to electrically the upper auxiliary interconnection. The upper gate contact hole and the upper auxiliary interconnection contact hole may be formed at the same time. An upper gate contact plug 352 may be formed of a conductive material to fill the upper gate contact hole. The upper auxiliary interconnection contact plug 351 may fill the upper auxiliary interconnection contact hole. The upper auxiliary interconnection contact plug 351 and the upper gate contact plug 352 may include at least one of metal, metal alloy, and silicide.

Returning to FIG. 6B, an upper interconnection 353 may be disposed on each of the upper auxiliary interconnection contact plug 351, the upper gate contact plug 352, and the upper semiconductor column 110. The upper interconnection 353 may extend on the same plane to be electrically connected.

Figure 8:
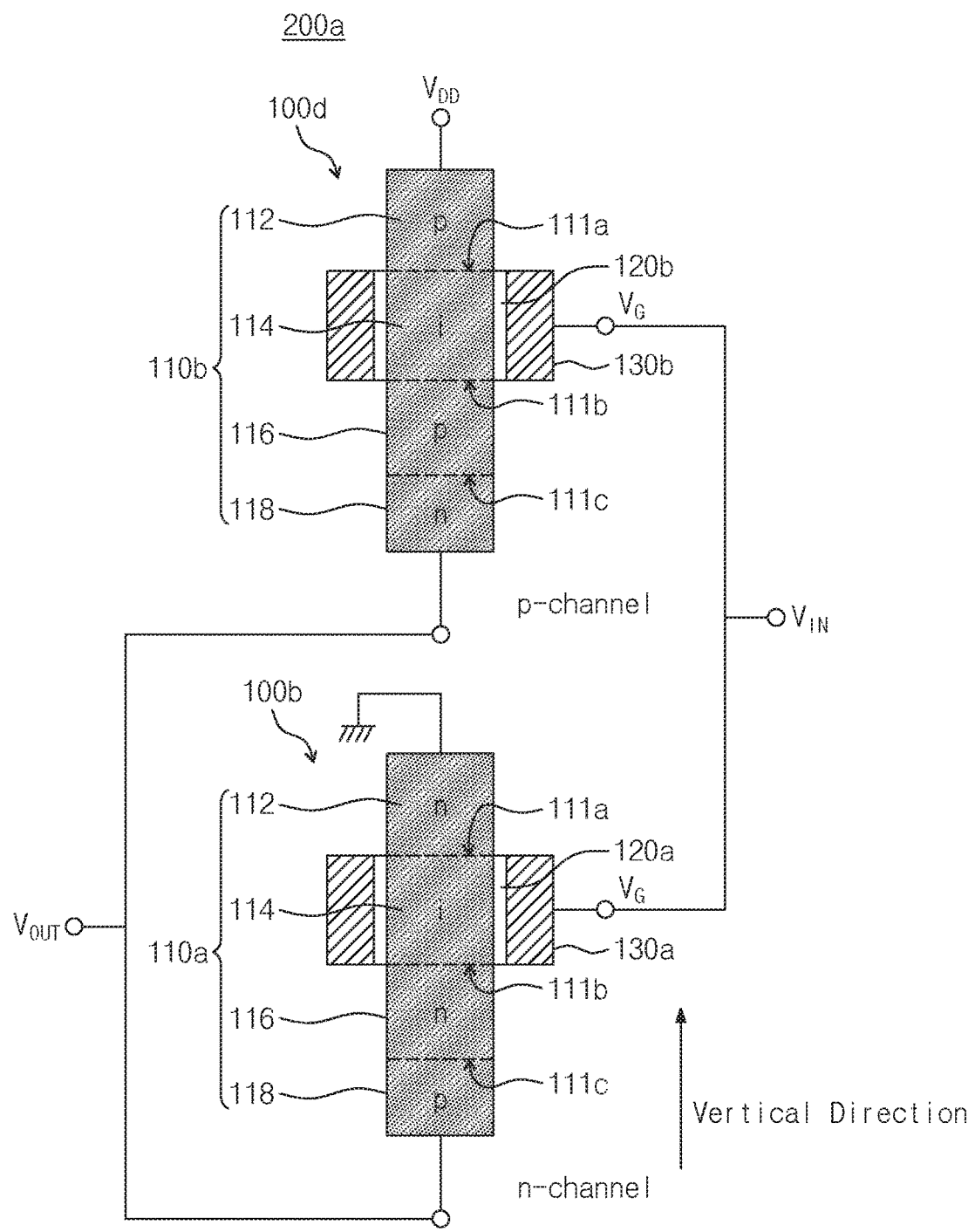
FIG. 8 is a conceptual diagram of a logic inverter according to another example embodiment of the present disclosure.

FIG. 8 is a conceptual diagram of a logic inverter according to another example embodiment of the present disclosure.

Figure 9:
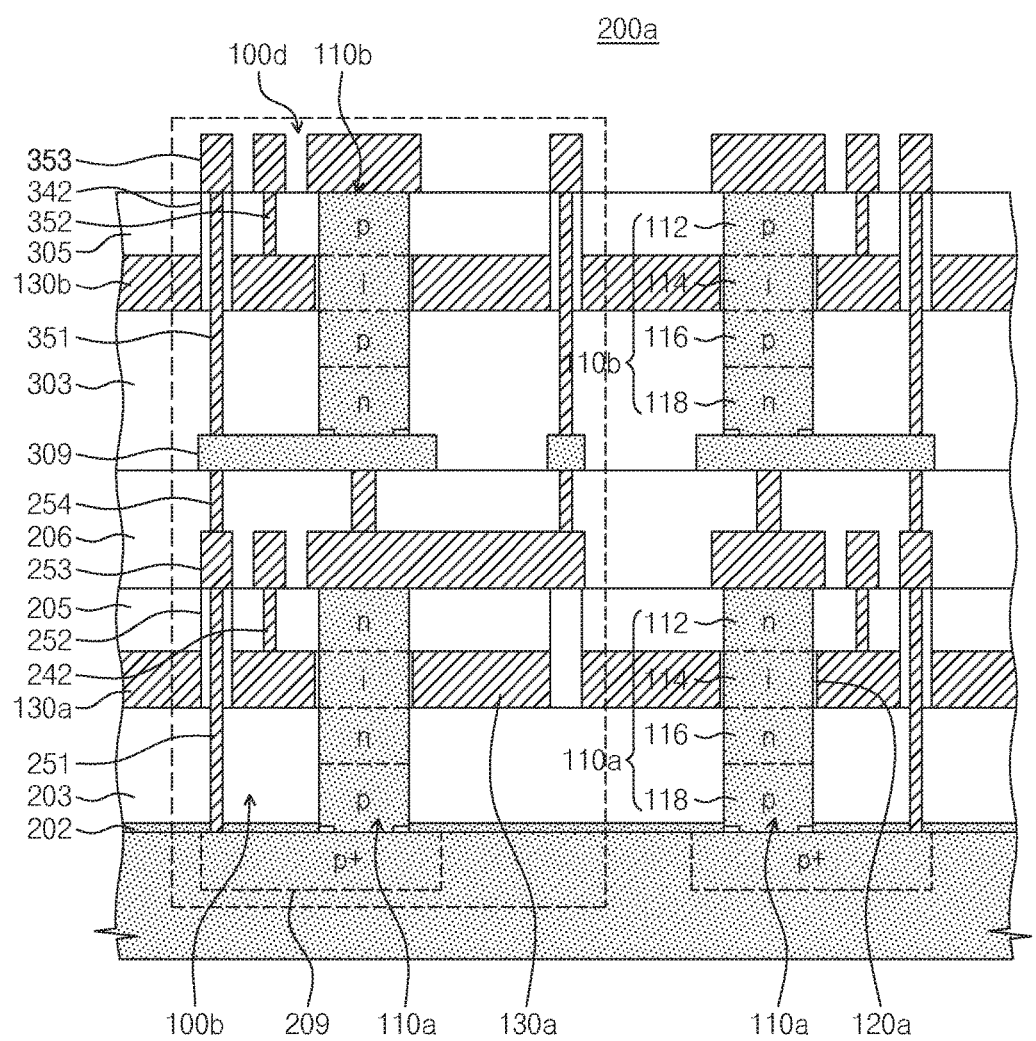
FIG. 9 is a cross-sectional view of the logic inverter in FIG. 8.

FIG. 9 is a cross-sectional view of the logic inverter in FIG. 8.

Referring to FIGS. 8 and 9, an inverter logic semiconductor device 200a includes a plurality of stacked transistors 100b and 100d. The transistors 100b and 100d include semiconductor columns 110a and 110b including a first conductive region 112 of first conductivity type, a second conductive region 118 of second conductivity type, an intrinsic region 114 disposed between the first conductivity region 112 and the second conductivity region 118, and a barrier region of the first conductivity type disposed between the intrinsic region 114 and the second conductive region 118; gate electrodes 30a and 130b disposed to cover the intrinsic region 114; and gate insulating layers 120a and 120b disposed between the gate electrode and the intrinsic region 114, respectively.

The plurality of stacked transistors 110b and 110d include a first transistor 110b and a second transistor 100d disposed above the first transistor 100b. The first conductivity type of the first transistor 100b may be n-type, and the first conductivity type of the second transistor 100d may be p-type. More specifically, the first transistor 100b may be an n-channel feedback semiconductor device and the second transistor 100d may be a p-channel feedback semiconductor device.

A lower semiconductor column 110a of the first transistor 100b may include the second conductive region 118 of second conductivity type, the barrier region 116 of first conductivity type, the intrinsic region 114k, and the first conductive region 112 of the first conductivity type which are sequentially disposed in a vertical direction. The first conductivity type may be p-type, and the second conductivity type may be n-type.

The upper semiconductor column 110b of the second transistor 100d may include the second conductive region 118 of second conductivity type, the barrier region of first conductivity type, the intrinsic region 114, and the first conductive region of the first conductivity type which are sequentially disposed in the vertical direction. The first conductivity type may be p-type, and the second conductivity type may be n-type.

The transistors 100b and 100d may include a first transistor 100b disposed at a lower layer and a second transistor 100d disposed at an upper layer.

The first transistor 100b may include a first lower interlayer dielectric 203 disposed on a substrate 201; a second lower interlayer dielectric 205 disposed on the first lower interlayer dielectric 203; a lower gate electrode 130a disposed between the first lower interlayer dielectric 203 and the second interlayer dielectric 205; a lower semiconductor column 110a disposed through the second lower interlayer dielectric 205, the lower gate electrode 130a, and the first lower interlayer dielectric 203; a lower gate insulating layer 120a disposed between the lower semiconductor column 110a and the lower gate electrode 130a; a lower interconnection 253 disposed on the second lower interlayer dielectric 205 and the lower semiconductor column 110a; and a third lower interlayer dielectric 206 disposed on the lower interconnection 253. The lower semiconductor column 110a of the first transistor 100b may include the second conductive region 118, the barrier region 116, the intrinsic region 114, and the first conductive region 112 which are sequentially disposed in a vertical direction. The lower semiconductor column 110a may provide an n-channel feedback semiconductor device. The first conductivity type of the lower transistor 100b may be n-type, and the second conductivity type thereof may be p-type.

The second transistor 100d may include a first upper interlayer dielectric 303 disposed on the third lower interlayer dielectric 206; a second upper interlayer dielectric 305 disposed on the first upper interlayer dielectric 303; an upper gate electrode 130b disposed between the first upper interlayer dielectric 303 and the second upper interlayer dielectric 305; an upper semiconductor column 110b disposed through the second upper interlayer dielectric 305, the upper gate electrode 130b, and the first upper interlayer dielectric 303; an upper gate insulating layer 120b disposed between the upper semiconductor column 110b and the upper gate electrode 130b; and an upper interconnection 253 disposed on the second upper interlayer dielectric 305 and the upper semiconductor column 110b.

The upper semiconductor column 110b may include a second conductive region 118 of second conductivity type, a barrier region 116 of first conductivity type, an intrinsic region 114, and a first conductive region 112 of the first conductivity type which are sequentially stacked in a vertical direction. The upper semiconductor column 110d may provide a p-channel feedback semiconductor device. The first conductivity type of the second transistor 100d may be p-type, and the second conductivity type thereof may be n-type.

Figure 10:
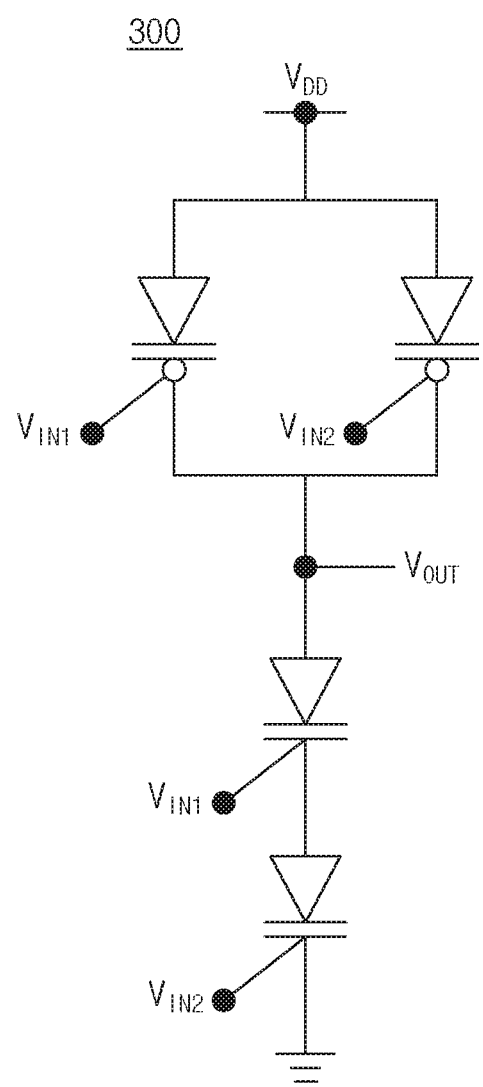
FIG. 10 is a circuit diagram of a NAND circuit according to another example embodiment of the present disclosure.

FIG. 10 is a circuit diagram of a NAND circuit according to another example embodiment of the present disclosure.

Figure 11:
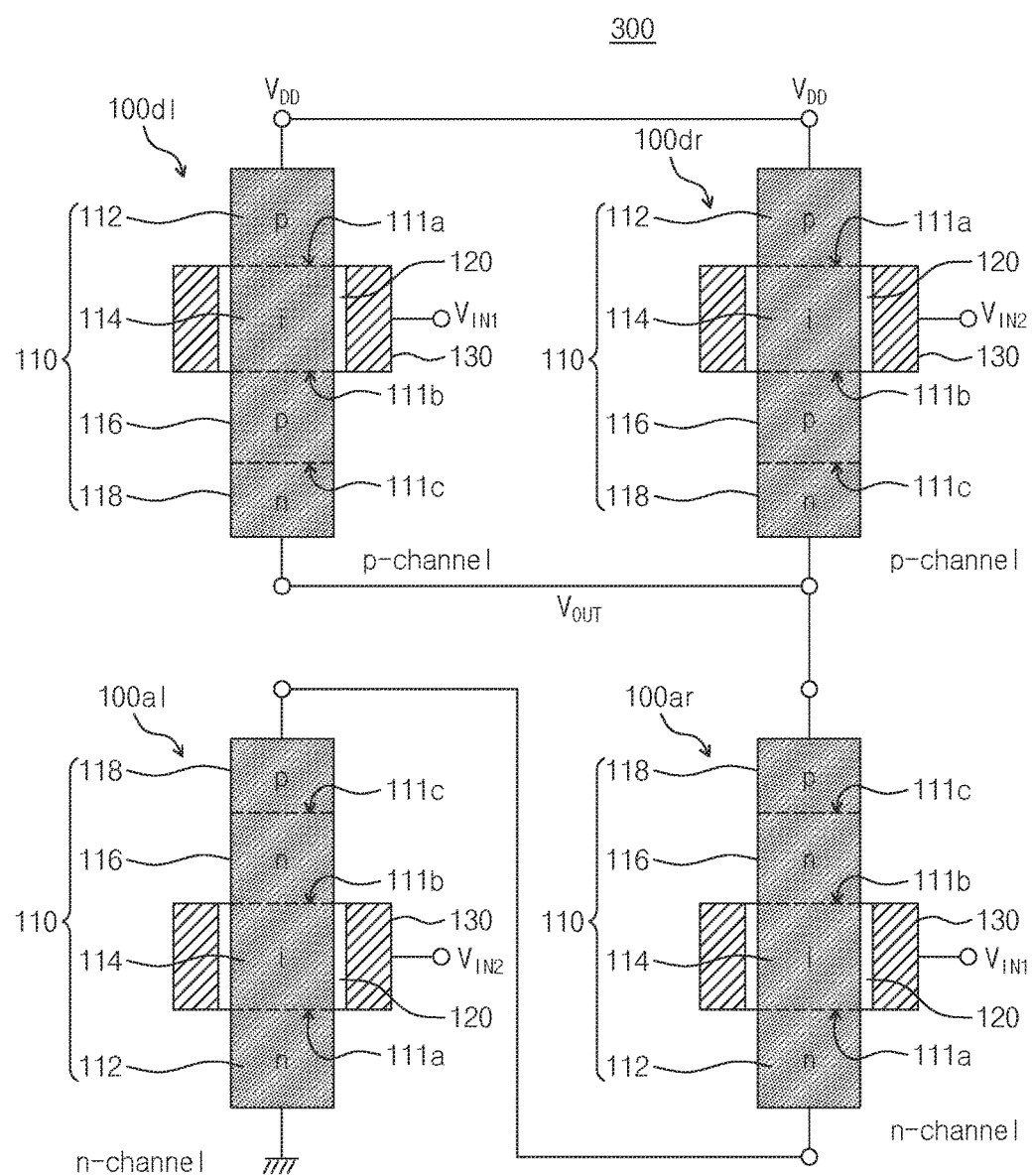
FIG. 11 is a conceptual diagram of the NAND circuit in FIG. 10.

FIG. 11 is a conceptual diagram of the NAND circuit in FIG. 10.

Figure 12:
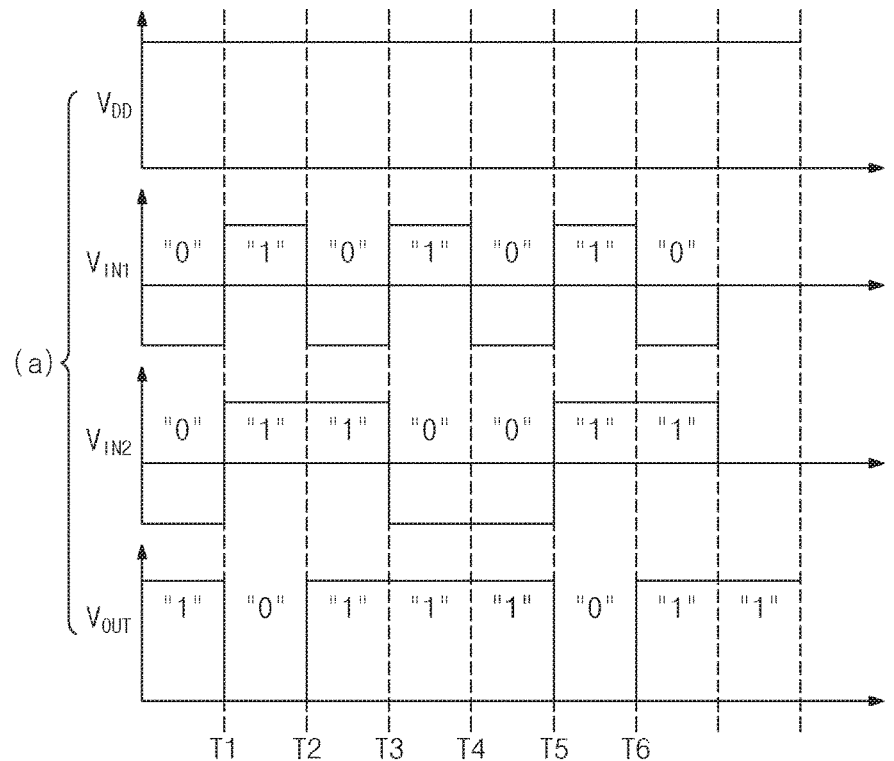
FIG. 12 is a timing diagram illustrating a state of the NAND circuit in FIG. 11.
Figure 12:
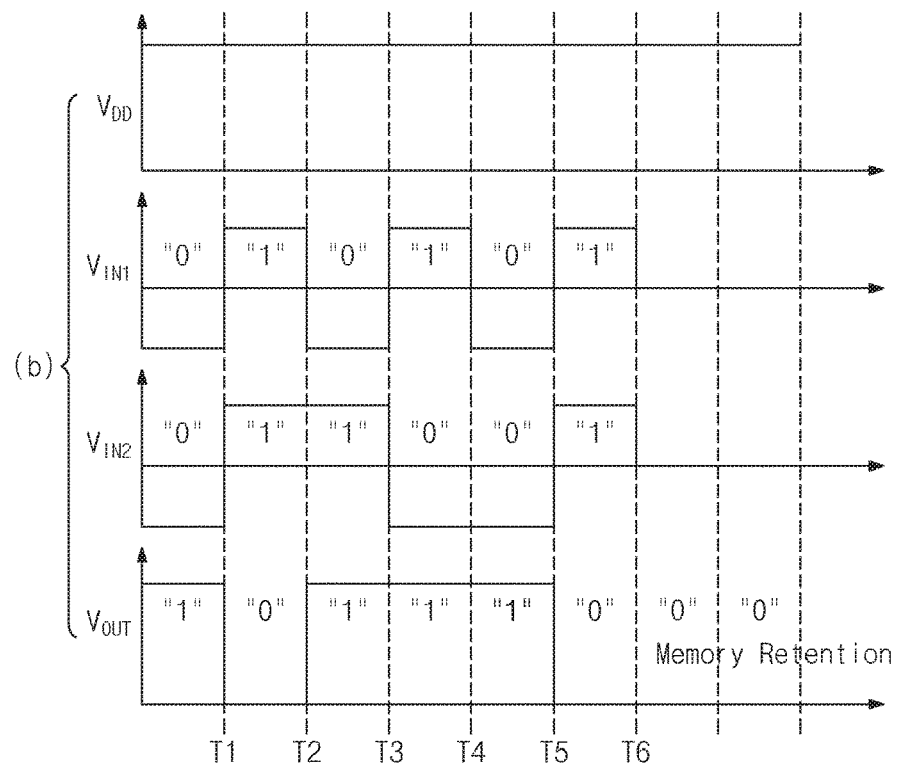

FIG. 12 is a timing diagram illustrating a state of the NAND circuit in FIG. 11.

Figure 13:
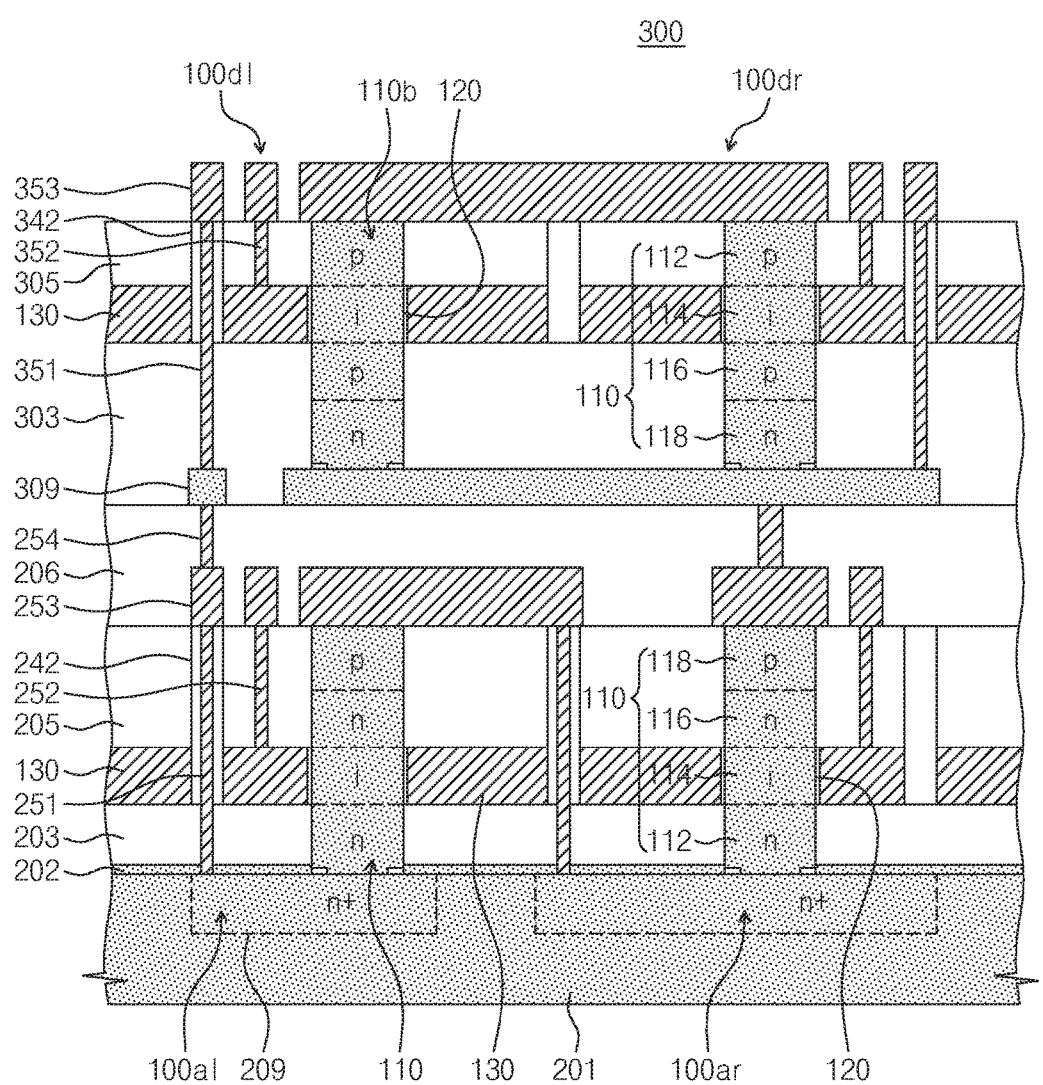
FIG. 13 is a cross-sectional view of the NAND circuit in FIG. 11.

FIG. 13 is a cross-sectional view of the NAND circuit in FIG. 11.

Referring to FIGS. 10 through 13, a NAND logic semiconductor device 300 includes a plurality of stacked transistors 100al, 100ar, 100dl, and 100dr. Each of the semiconductor transistors 100al, 100ar, 100dl, and 100dr includes a semiconductor column 110 including a first conductive region 112 of first conductivity type, a second conductive region 118 of second conductivity type, an intrinsic region 114 disposed between the first conductive region 112 and the second conductive region 118, and a barrier region 116 disposed between the intrinsic region 114 and the second conductive region 118; a gate electrode 130 disposed to cover the intrinsic region 114; and a gate insulating layer 120 disposed between the gate electrode 130 and the intrinsic region 114.

The plurality of stacked transistors 100al, 100ar, 100dl, and 100dr may include a pair of first transistors 100al and 100ar disposed at a lower layer and a pair of second transistors 100dl and 100dr disposed at an upper layer.

The semiconductor column 110 of each of the first transistors 100al and 100ar may include a first conductive region 112, an intrinsic region 114, a barrier region 116, and a second conductive region 118 which are sequentially disposed in a vertical direction.

The semiconductor column 110 of each of the second transistors 100dl and 100dr may include a second conductive region 118, a barrier region 116, an intrinsic region 114, and a first conductive region 112 which are sequentially disposed in the vertical direction.

The first transistors 100al and 100ar and the second transistors 100dl and 100dr may constitute a NAND logic circuit. A first conductivity type of the semiconductor column 110 of each of the first transistors 100al and 100ar may be n-type, and the semiconductor column 110 of each of the first transistors 100al and 100ar may provide an n-channel semiconductor device.

The first conductivity type of the semiconductor column 110 of each of the second transistors 100dl and 100dr may be p-type, and the semiconductor column 110 of each of the second transistors 100dl and 100dr may provide a p-channel semiconductor device.

The pair of first transistors 100al and 100ar may include a first left transistor 100al and a first right transistor 100ar. A first conductive region (source) of the first left transistor 100al may be grounded, and a second conductive region (drain) of the first left transistor 100al may be connected to a first conductive region (source) of the first right transistor 100ar. A gate electrode 130 of the first left transistor 100ar may receive a second input signal $V_{IN2}$, and a gate electrode 130 of the first right transistor 100ar may receive a first input signal $V_{IN1}$.

The pair of second transistors 100dl and 100dr may include a second left transistor 100dl and a second right transistor 100dr. First conductive regions (drains) of the second transistors 100dl and 100dr are connected to each other to be connected to an externally applied voltage $V_{DD}$, and second conductive regions (sources) of the second transistors 100dl and 100dr may be connected to each other to provide an output signal $V_{OUT}$ and to be connected to the second conductive region (drain) of the first right transistor 100ar. A gate electrode 130 of the second left transistor 100dl receives the first input signal $V_{IN1}$, and a gate electrode 130 of the second right transistor 100dr may receive the second input signal $V_{IN2}$.

The first input signal VIN1 and the second input signal VIN2 may indicate logic "1" or "0". A logic "1" state may be a positive voltage, and a logic "0" state may be a negative voltage. The output signal VOUT may indicate the logic "1" or "0" state according to NAND logic.

In the NAND circuit, when the input signal $V_{IN1}/V_{IN2}$ is not provided or is grounded, the output signal $V_{OUT}$ may memorize and output a result of a previous state. For example, when the input signals $V_{IN1}/I_{VN2}$ is a ground signal that does not indicate the logic "1" or "0" state at a time T6, the output signal $V_{OUT}$ may continuously retain data (logic "0" state) memorized during a previous period T5-T6. That is, the NAND circuit may retina the output signal $V_{OUT}$ of a previous state even when the input signal $V_{IN1}/V_{IN2}$ is removed.

Each of the first transistors 100al and 100ar may include a first lower interlayer dielectric 203 disposed on the substrate 201; a second lower interlayer dielectric 205 disposed on the first lower interlayer dielectric 203; a lower gate electrode 130 disposed between the first lower interlayer dielectric 203 and the second lower interlayer dielectric 205; a lower semiconductor column 110 disposed through the second lower interlayer dielectric 205, the lower gate electrode 130, and the first lower interlayer dielectric 203; a lower gate insulating layer 120 disposed between the lower semiconductor column 110 and the lower gate electrode 130; a lower interconnection 253 disposed on the second lower interlayer dielectric 205 and the lower semiconductor column 110; and a third lower interlayer dielectric 206 disposed on the lower interconnection 253.

The lower semiconductor column 110 of each of the first transistors 100al and 100ar may include the first conductive region 112, the intrinsic region 114, the barrier region 116, and the second conductive region 118 which are sequentially disposed in a vertical direction. The lower semiconductor column 110 may provide an n-channel feedback semiconductor device. The first conductivity type of the lower semiconductor column 110 of each of the first transistors 100al and 100ar may be n-type, and the second conductivity type of the lower semiconductor column 110 of each of the first transistors 100dl and 100dr may be p-type.

Each of the second transistors 100dl and 100dr may include a first upper interlayer dielectric 303 disposed on the third lower interlayer dielectric 206; a second upper interlayer dielectric 305 disposed on the first upper interlayer dielectric 203; an upper gate electrode 130 disposed between the first upper interlayer dielectric 303 and the second upper interlayer dielectric 305; an upper semiconductor column 110 disposed through the second upper interlayer dielectric 305, the upper gate electrode 130, and the first upper interlayer dielectric 303; an upper gate insulating layer 120 disposed between the upper semiconductor column 110 and the upper gate electrode 30; and an upper interconnection 253 disposed on the second interlayer dielectric 305 and the upper semiconductor column 110.

The upper semiconductor column 110 may include a second conductive region 118 of second conductivity type, a barrier region 116 of first conductivity type, an intrinsic region 114, and a first conductive region 112 of the first conductivity type which are sequentially stacked in the vertical direction. The semiconductor column 110 may provide a p-channel feedback semiconductor device. The first conductivity type of the upper semiconductor column 110 of each of the second transistors 100dl and 100dr may be p-type, and the second conductivity type of the lower semiconductor column 110 of each of the second transistors 100dl and 100dr may be n-type.

Figure 14:
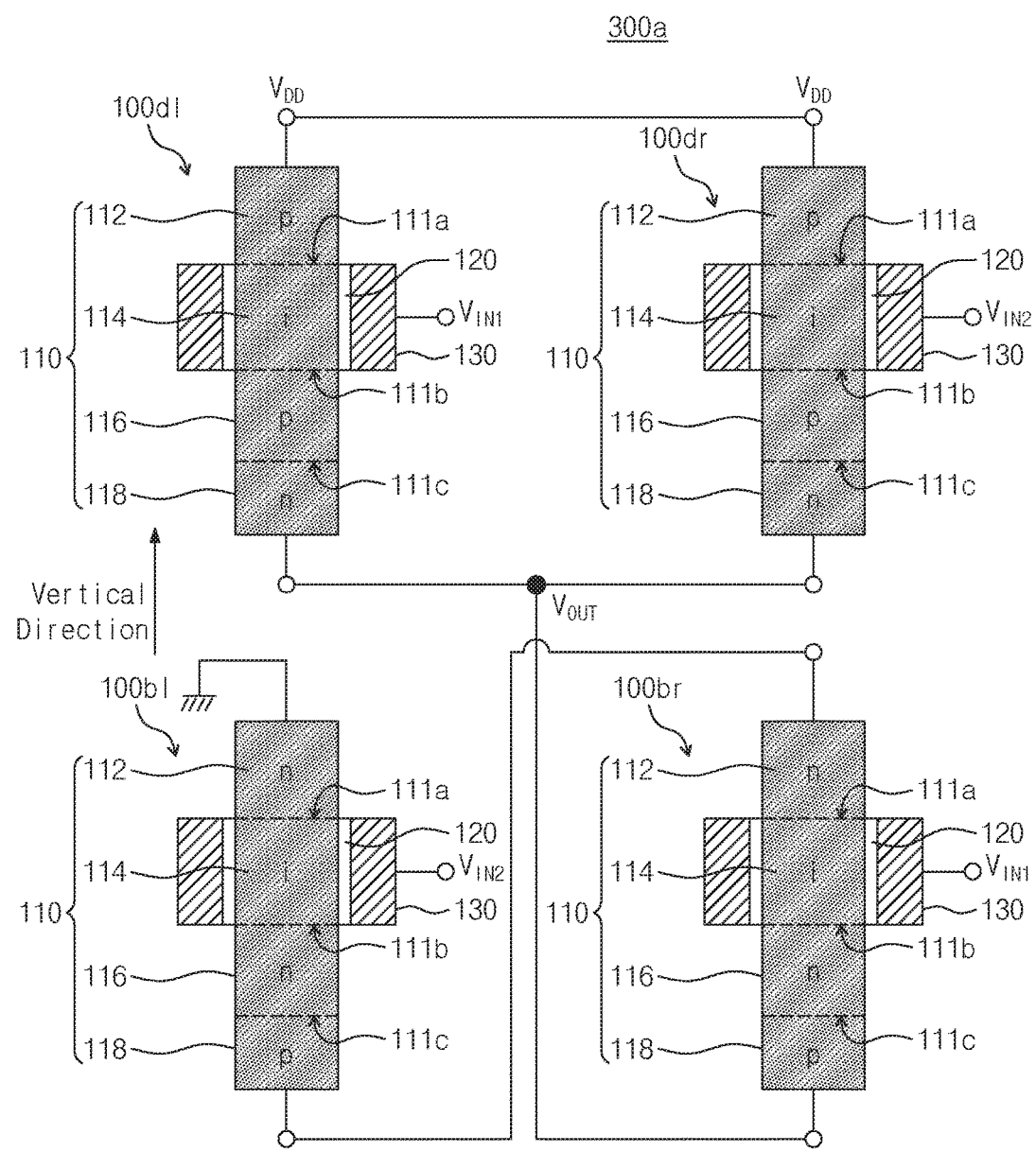
FIG. 14 is a conceptual diagram of a NAND circuit according to another example embodiment of the present disclosure.

FIG. 14 is a conceptual diagram of a NAND circuit according to another example embodiment of the present disclosure.

Figure 15:
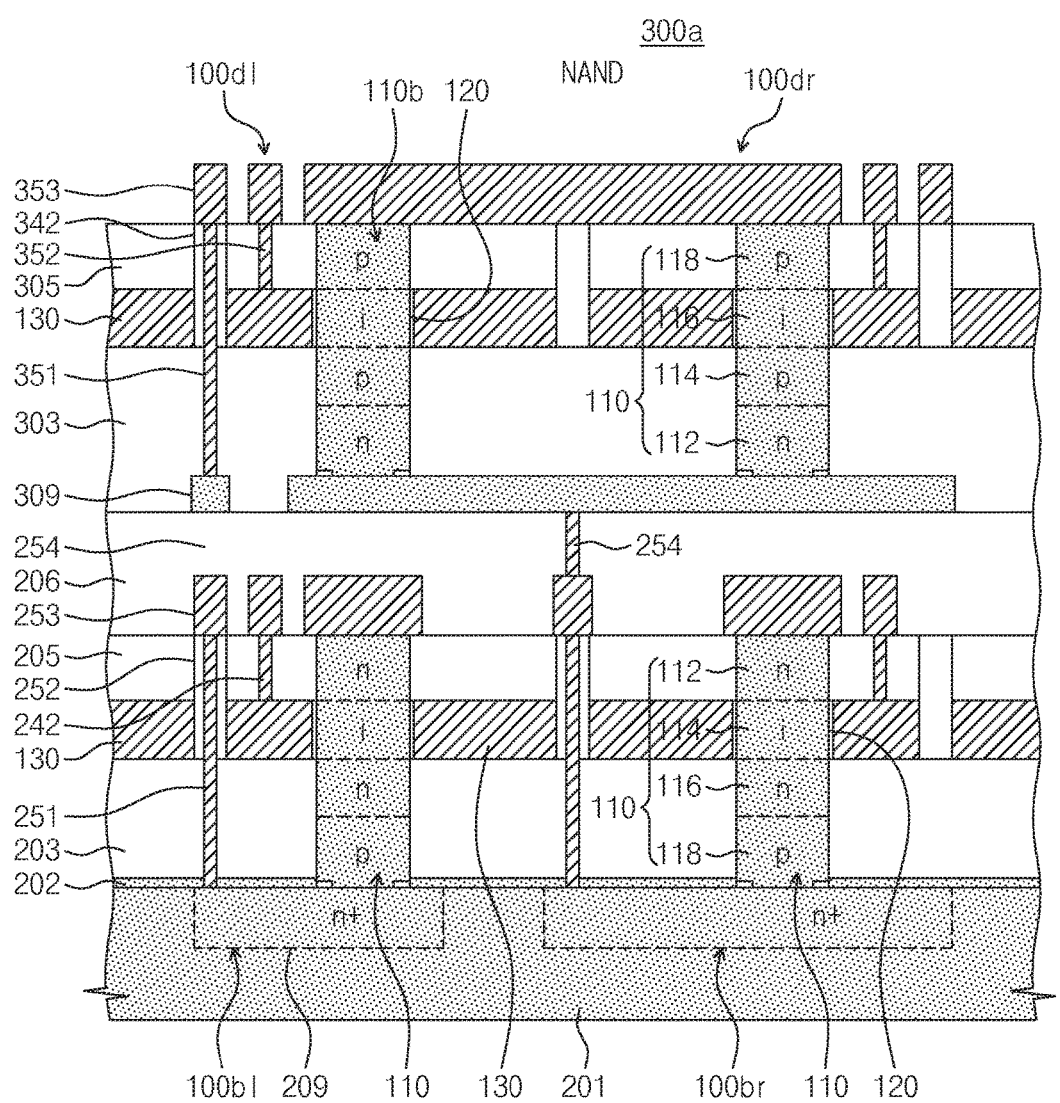
FIG. 15 is a cross-sectional view of the NAND circuit in FIG. 14.

FIG. 15 is a cross-sectional view of the NAND circuit in FIG. 14.

Referring to FIGS. 14 and 15, a NAND logic semiconductor device 300a includes a plurality of stacked transistors 100bl, 100br, 100dl, and 100dr. Each of the transistors 100bl, 100br, 100dl, and 100dr includes a semiconductor column 110 including a first conductive region 112 of first conductivity type, a second conductive region 118 of second conductivity type, an intrinsic region 116 disposed between the first conductive region 112 and the second conductive region 118, and a barrier region 116 disposed between the intrinsic region 116 and the second conductive region 118; a gate electrode 130 disposed to cover the intrinsic region 116 and a gate insulating layer 120 disposed between the gate electrode 130 and the intrinsic region 116.

The plurality of stacked transistors 100bl, 100br, 100dl, and 100dr may include a pair of first transistors 100bl and 100br disposed at a lower layer and a pair of second transistors 100dl and 100dr disposed at an upper layer.

The semiconductor column 110 of each of the first transistors 100bl and 100br may include a second conductive region 118, a barrier region 116, an intrinsic region 114, and a first conductive region 112 which are sequentially disposed in a vertical direction.

The semiconductor column 110 of each of the second transistors 100dl and 100dr may include a second conductive region 118, a barrier region 116, an intrinsic region 114, and a first conductive region which are sequentially disposed in the vertical direction.

The first transistors 100bl and 100br and the second transistors 100dl and 100dr may constitute a NAND logic circuit. The first conductivity type of the semiconductor column 110 of each of the first transistors 100bl and 100br may be n-type, and the first conductivity type of the semiconductor column 110 of each of the second transistors 100dl and 100dr may be p-type.

The pair of first transistors 100bl and 100br may include a first left transistor 100bl and a first right transistor 100br. A first conductive region (source) of the first left transistor 100bl may be grounded, and a second conductive region (drain) thereof may be connected to a first conductive region (source) of the first right transistor 100br. A gate electrode 130 of the first left transistor 100bl may receive a second input signal $V_{IN2}$, and a gate electrode 130 of the first right transistor 100br may receive a first input signal $V_{IN1}$.

The pair of second transistors 100dl and 100dr may include a second left transistor 100dl and a second right transistor 100dr. First conductive regions (drains) of the second transistors 100dl and 100dr may be connected to each other to be connected to an externally applied voltage VDD, and second conductive regions (sources) of the pair of second transistors 100dl and 100dr may be connected to each other to provide an output signal $V_{OUT}$ and to be connected to a second conductive region (drain) of the first right transistor 100br. A gate electrode 130 of the second left transistor 100dl may receive a first input signal $V_{IN1}$, and a gate electrode 130 of the second right transistor 100dr may receive a second input signal $V_{IN2}$.

Each of the first transistors 100bl and 100br may include a first lower interlayer dielectric 203 disposed on a substrate 201; a second lower interlayer dielectric 205 disposed on the first lower interlayer dielectric 203; a lower gate electrode 130 disposed between the first lower interlayer dielectric 203 and the second lower interlayer dielectric 205; a lower semiconductor column 110 disposed through the second lower interlayer dielectric 205, the lower gate electrode 130, and the first lower interlayer dielectric 203; a lower gate insulating layer 120 disposed between the lower semiconductor column 110 and the lower gate electrode 130; a lower interconnection 253 disposed on the second lower interlayer dielectric 205 and the lower semiconductor column 110; and a third lower interlayer dielectric 206 disposed on the lower interconnection 253.

The lower semiconductor column 110 of each of the first transistor 100bl and 100br may include the second conductive region 118, the barrier region 116, the intrinsic region 114, and the first conductive region 112 which are sequentially disposed in the vertical direction. The lower semiconductor column 110 may provide an n-channel feedback semiconductor device. The first conductivity type of the lower semiconductor column 110 of each of the first transistor 100bl and 100br may be n-type, and the second conductivity type of the lower semiconductor column 110 of each of the first transistor 100bl and 100br may be p-type.

Each of the second transistors 100dl and 100dr may include a first upper interlayer dielectric 303 disposed on the third lower interlayer dielectric 206; a second upper interlayer dielectric 305 disposed on the first upper interlayer dielectric 203; an upper gate electrode 130 disposed between the first upper interlayer dielectric 303 and the second upper interlayer dielectric 305; an upper semiconductor column 110 disposed through the second upper interlayer dielectric 305, the upper gate electrode 130, and the first upper interlayer dielectric 303; an upper gate insulating layer 120 disposed between the upper semiconductor column 110 and the upper gate electrode 130; and an upper interconnection 253 disposed on the second upper interlayer dielectric 305 and the upper semiconductor column 110.

The upper semiconductor column 110 may include a second conductive region 118 of second conductivity type, a barrier region 116 of first conductivity type, an intrinsic region 114, and a first conductive region 112 of the first conductivity type which are sequentially stacked in the vertical direction. The upper semiconductor column 110 may provide a p-channel feedback semiconductor device. The first conductivity type of the second transistors 100dl and 100dr may be p-type and the second conductivity type thereof may be n-type.

Figure 16:
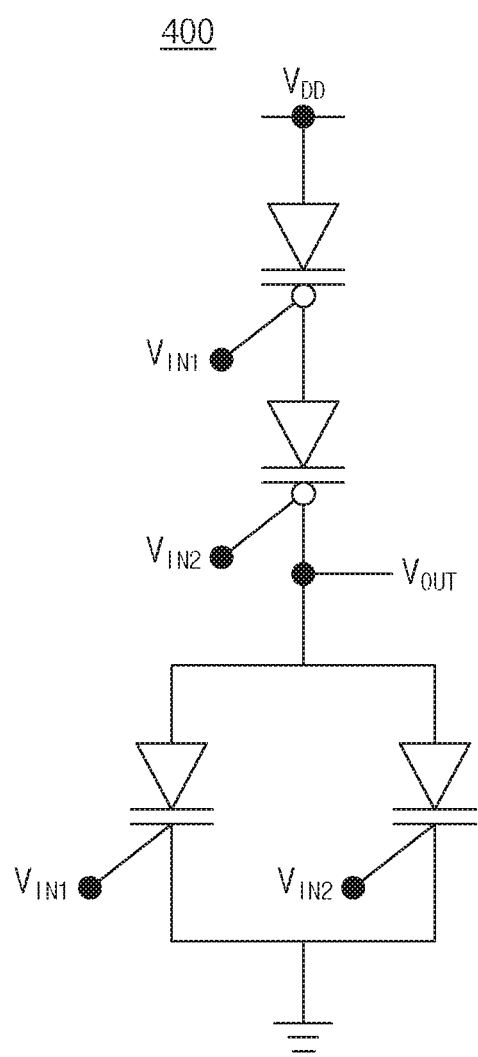
FIG. 16 is a circuit diagram of a NOR circuit according to another example embodiment of the present disclosure.

FIG. 16 is a circuit diagram of a NOR circuit according to another example embodiment of the present disclosure.

Figure 17:
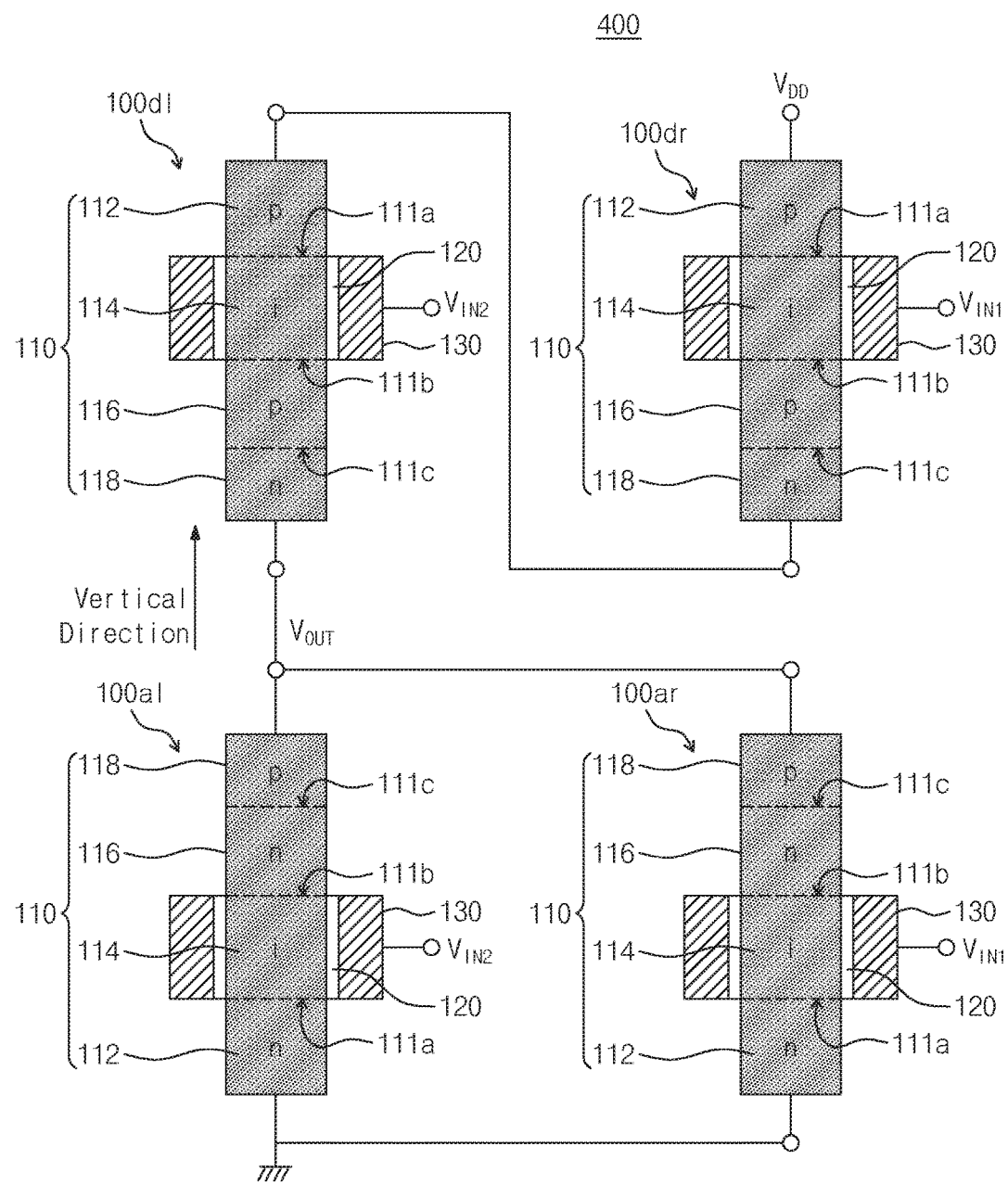
FIG. 17 is a conceptual diagram of the NOR circuit in FIG. 16.

FIG. 17 is a conceptual diagram of the NOR circuit in FIG. 16.

Figure 18:
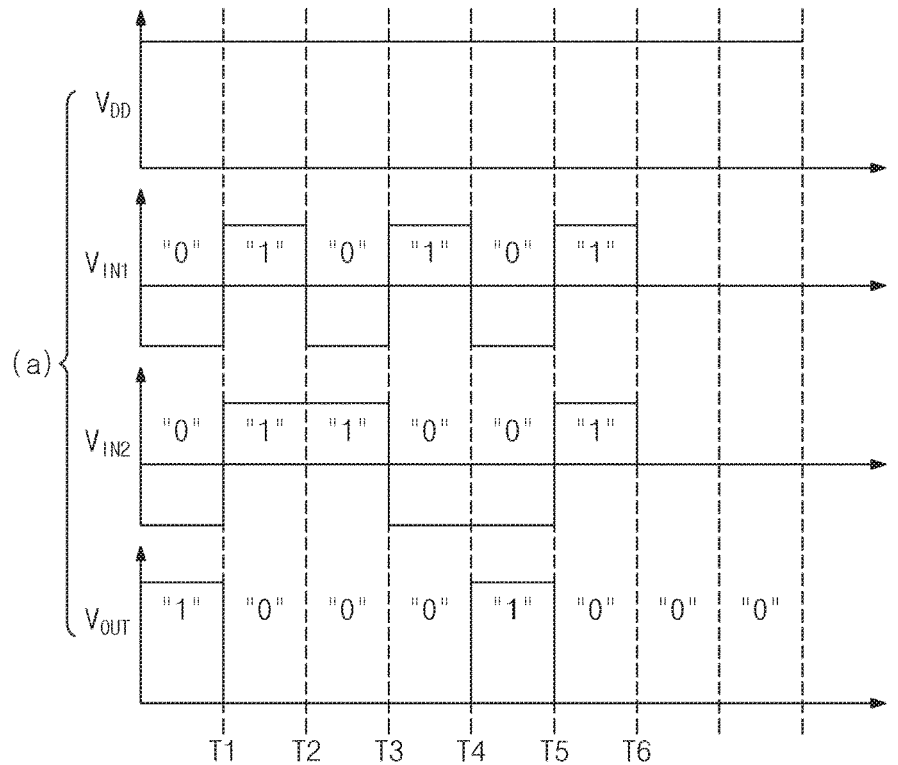
FIG. 18 is a timing diagram illustrating a state of the NOR circuit in FIG. 17.
Figure 18:
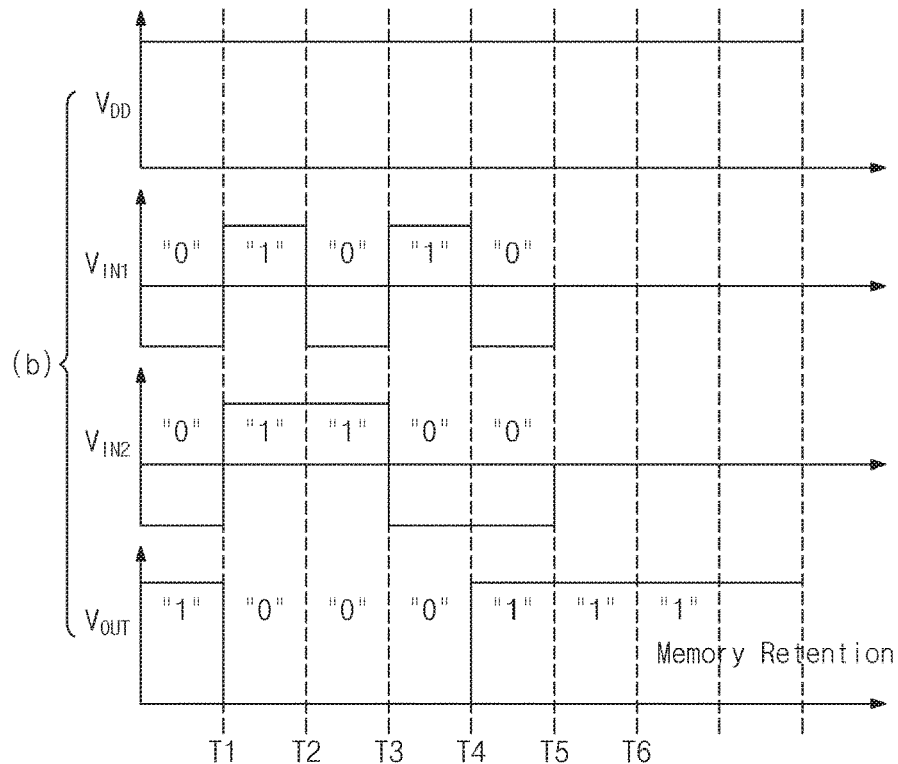

FIG. 18 is a timing diagram illustrating a state of the NOR circuit in FIG. 17.

Figure 19:
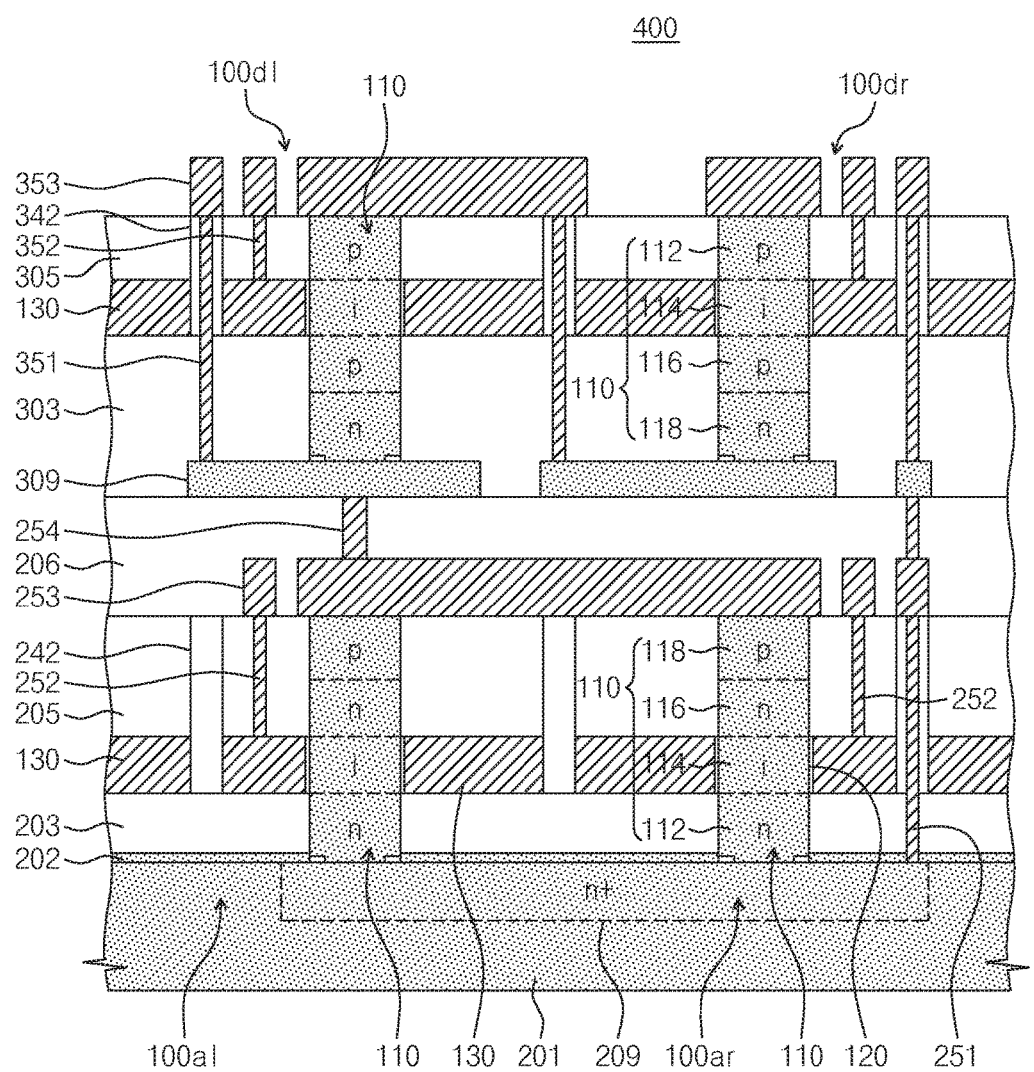
FIG. 19 is a cross-sectional view of the NOR circuit in FIG. 17.

FIG. 19 is a cross-sectional view of the NOR circuit in FIG. 17.

Referring to FIGS. 16 through 19, a NOR logic semiconductor device 400 includes a plurality of stacked transistors 100*al*, 100*ar*, 100*dl*, and 100*dr*. Each of the transistors 100*al*, 100*ar*, 100*dl*, and 100*dr* includes a semiconductor column 110 including a first conductive region 112 of first conductivity type, a second conductive region 118 of second conductivity type, an intrinsic region 114 disposed between the first conductive region 112 and the second conductive region 118, and a barrier region of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114.

The plurality of stacked transistors 100*al*, 100*ar*, 100*dl*, and 100*dr* may include a pair of first transistors 100*al* and 100*ar* disposed at a lower layer and a pair of second transistors 100*dl* and 100*dr* disposed at an upper layer.

The semiconductor column 110 of each of the first transistors 100*al* and 100*ar* may include a first conductive region 112, an intrinsic region 114, a barrier region 116, and a second conductive region 118 which are sequentially disposed in a vertical direction.

The semiconductor column 110 of each of the second transistors 100*dl* and 100*dr* may include a second conductive region 118, a barrier region 116, an intrinsic region 114, and a first conductive region 112 which are sequentially disposed in the vertical direction.

The first transistors 100*al* and 100*ar* and the second transistors 100*dl* and 100*dr* may constitute a NOR logic circuit. The first conductivity type of the first transistors 100*al* and 100*ar* may be n-type, and the first conductivity type of the second transistors 100*dl* and 100*dr* may be p-type.

The pair of first transistors 100*al* and 100*ar* may include a first left transistor 100*al* and a first right transistor 100*ar*. A first conductive region (source) of the first left transistor 100*al* and a first conductive region (source) of the first right transistor 100*ar* may be connected to each other to be grounded. A second conductive region (drain) of the first left transistor 100*al* and a second conductive region (drain) of the first right transistor 100*ar* may be connected to each other to provide an output signal $V_{OUT}$.

The gate electrode 130 of the first left transistor 100*al* may receive a second input signal $V_{IN2}$, and the gate electrode 130 of the first right transistor 100*br* may receive a first input signal $V_{IN1}$.

The pair of second transistors 100*dl* and 100*dr* may include a second left transistor 100*dl* and a second right transistor 100*dr*. A second conductive region (source) of the second left transistor 100*dl* may be connected to second conductive regions (drains) of the first transistors 100*al* and 100*ar*. A first conductive region (drain) of the second left transistor 100*dl* may be connected to a second conductive region (source) of the second right transistor 100*dr*. A first conductive region (drain) of the second right transistor 100*dr* may be connected to an externally applied voltage $V_{DD}$. The gate electrode 130 of the second left transistor 100*dl* may receive a second input signal $V_{IN2}$, and the gate electrode 130 of the second right transistor 100*dr* may receive a first input signal $V_{IN1}$.

The first input signal $V_{IN1}$ and the second input signal $V_{IN2}$ may indicate logic "1" or "0". A logic "1" state may be a positive voltage, and a logic "0" state may be a negative voltage. The output signal $V_{OUT}$ may indicate logic "1" and "0" states according to NOR logic.

In the NOR circuit, when the input signal $V_{IN1}/V_{IN2}$ is not provided or is grounded, the output signal $V_{OUT}$ may memorize and output a result of a previous state. For example, when the input signal $V_{IN1}/V_{IN2}$ is a ground signal that does not indicate logic "1" or "0", the output signal $V_{OUT}$ may continuously retain data (logic "1" state) memorized during a previous period T4-T5. That is, the NOR circuit may retain an output signal of a previous state even when the input signal is removed.

Each of the first transistors 100*al* and 100*ar* may include a first lower interlayer dielectric 203 disposed on a substrate 201; a second lower interlayer dielectric 205 disposed on the first lower interlayer dielectric 203; a lower gate electrode 130 disposed between the first lower interlayer dielectric 203 and the second lower interlayer dielectric 205; a lower semiconductor column 110 disposed through the second lower interlayer dielectric 205, the lower gate electrode 130, and the first lower interlayer dielectric 203; a lower gate insulating layer 120 disposed between the lower semiconductor column 110 and the lower gate electrode 203; a lower interconnection 253 disposed on the second lower interlayer dielectric 205 and the lower semiconductor column 110; and a third lower interlayer dielectric 206 disposed on the lower interconnection 253.

The lower semiconductor column 110 of each of the first transistors 100*al* and 100*ar* may include a first conductive region 112, an intrinsic region 114, a barrier region 116, and a second conductive region 118 which are sequentially disposed in the vertical direction. The lower semiconductor column 110 may provide an n-channel feedback semiconductor device. The first conductivity type of the first transistors 100*al* and 100*ar* may be n-type and the second conductivity type thereof may be p-type.

Each of the second transistors 100*dl* and 100*dr* may include a first upper interlayer dielectric 303 disposed on the third lower interlayer dielectric 206; a second upper interlayer dielectric 305 disposed on the first upper interlayer dielectric 303; an upper gate electrode 130 disposed between the first upper interlayer dielectric 303 and the second upper interlayer dielectric 305; an upper semiconductor column 110 disposed through the second upper interlayer dielectric 305, the upper gate electrode 130, and the first upper interlayer dielectric 303; an upper gate insulating layer 120 disposed between the upper semiconductor column 110 and the upper gate electrode 130; and an upper interconnection disposed on the second upper interlayer dielectric 305 and the upper semiconductor column 110.

The upper semiconductor column 110 may include a second conductive region 118 of second conductivity type, a barrier region 116 of first conductivity type, an intrinsic region 114, and a first conductive region 112 of the first conductivity type which are sequentially stacked in the vertical direction. The upper semiconductor column 110 may provide a p-channel feedback semiconductor device. The first conductivity type of the second transistors 100*dl* and 100*dr* may be p-type and the second conductivity type thereof may be n-type.

Figure 20:
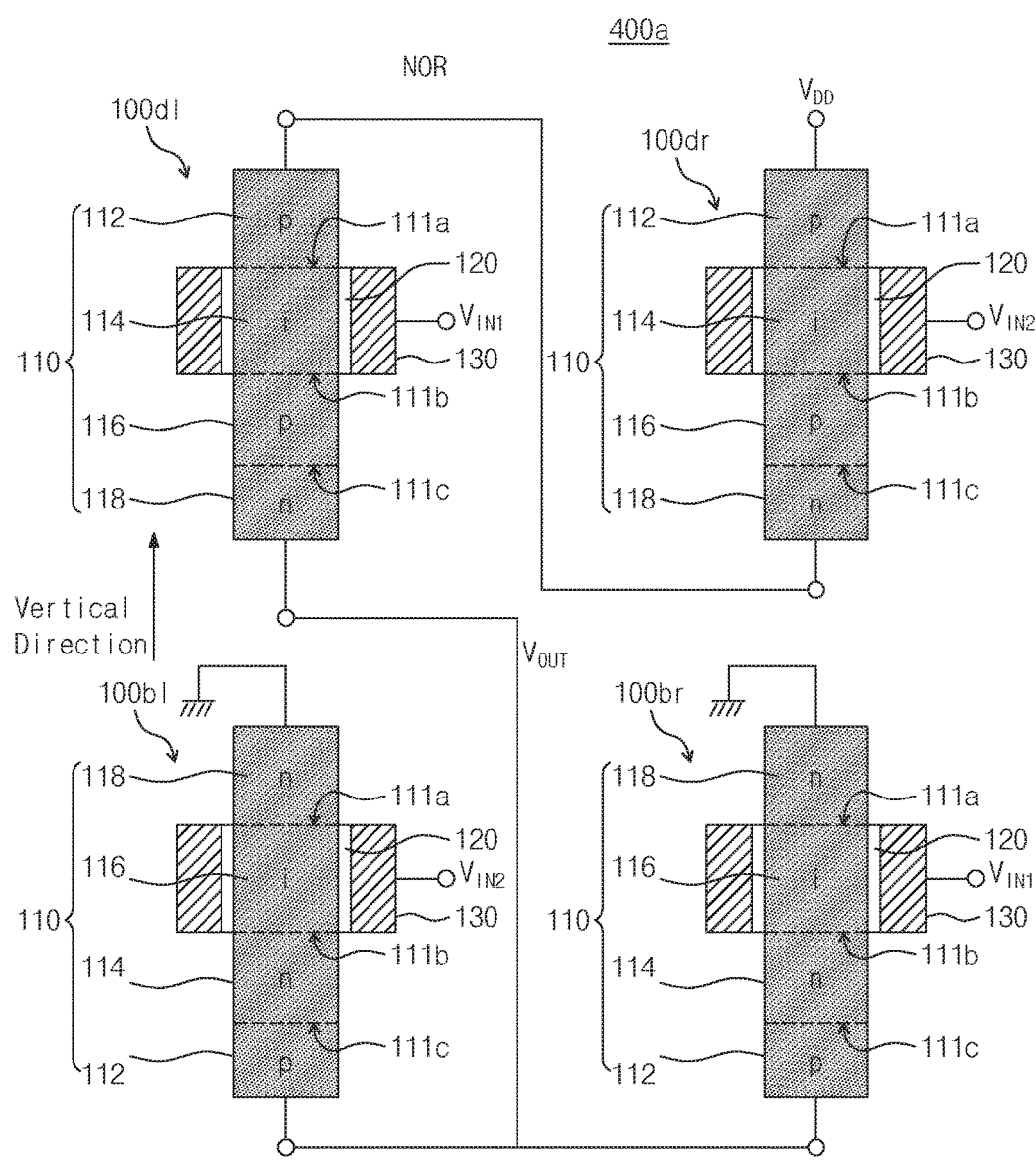
FIG. 20 is a conceptual diagram of a NOR circuit according to another example embodiment of the present disclosure.

FIG. 20 is a conceptual diagram of a NOR circuit according to another example embodiment of the present disclosure.

Figure 21:
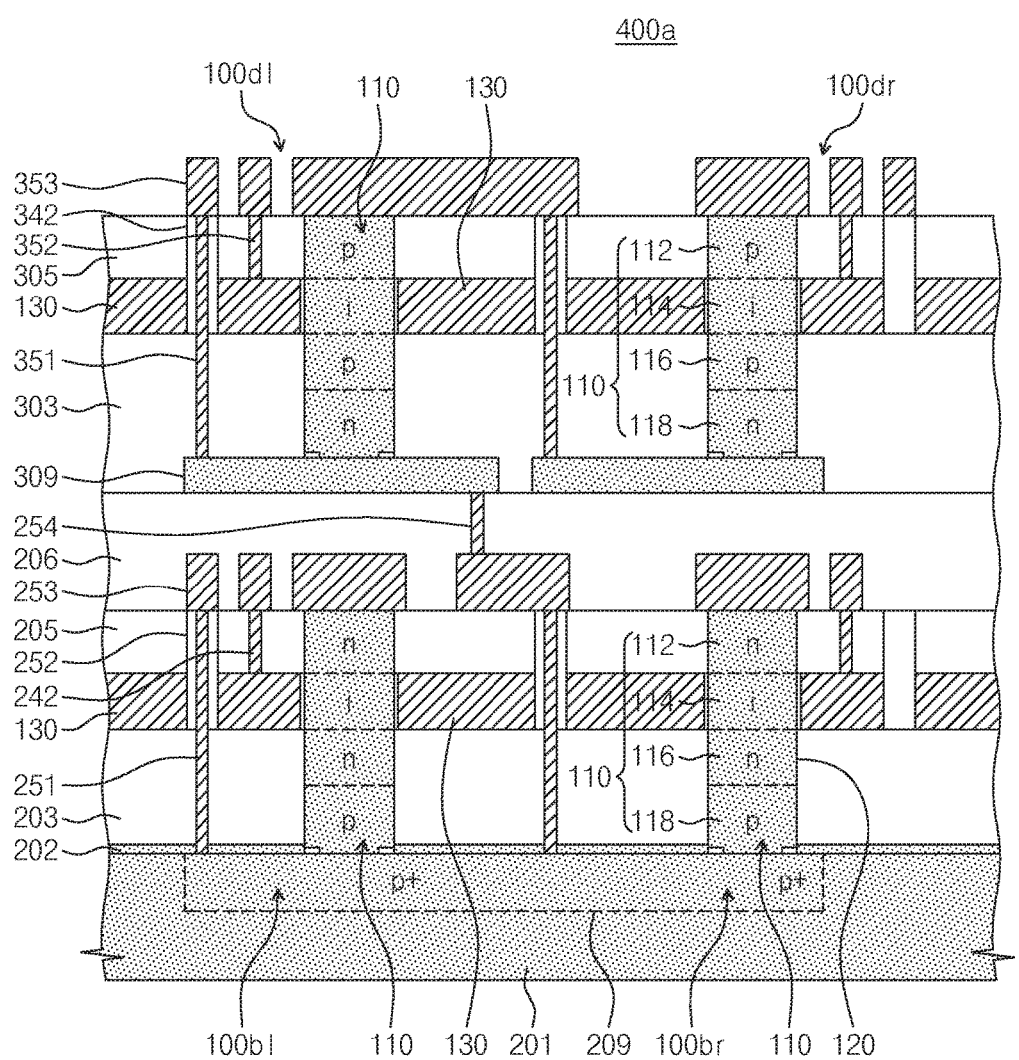
FIG. 21 is a cross-sectional view of the NOR circuit in FIG. 20.

FIG. 21 is a cross-sectional view of the NOR circuit in FIG. 20.

Referring to FIGS. 20 and 21, a NOR logic semiconductor device 400*a* includes a plurality of stacked transistors 100*bl*, 100*br*, 100*dl*, and 100*dr*. Each of the transistors 100*bl*, 100*br*, 100*dl*, and 100*dr* includes a semiconductor column 110 including a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114.

The plurality of stacked transistors 100*bl*, 100*br*, 100*dl*, and 100*dr* may include a pair of first transistors 100*bl* and 100*br* disposed at a lower layer and a pair of second transistors 100*dl* and 100*dr* disposed at an upper layer.

The semiconductor column 110 of each of the first transistors 100*bl* and 100*br* may include a second conductive region 118, a barrier region 116, an intrinsic region 114, and a first conductive region 112 which are sequentially disposed in a vertical direction.

The semiconductor column 110 of each of the second transistors 100*dl* and 100*dr* may include a second conductive region 118, a barrier region 116, an intrinsic region 114, and a first conductive region 112 which are sequentially disposed in the vertical direction.

The first transistors 100*bl* and 100*br* and the second transistors 100*dl* and 100*dr* may constitute an NOR logic circuit. The first conductivity type of the first transistors 100*bl* and 100*br* may be n-type, and the first conductivity type of the second transistors 100*dl* and 100*dr* may be p-type.

The pair of first transistors 100*bl* and 100*br* may include a first left transistor 100*bl* and a first right transistor 100*br*. A first conductive region (source) of the first left transistor 100*bl* may be grounded. A second conductive region (drain) of the first left transistor 100*bl* may be connected to a second conductive region of the first right transistor 100*br* and may provide an output signal $V_{OUT}$. A first region (source) of the first right transistor 100*br* may be grounded.

A gate electrode 130 of the first left transistor 100*bl* may receive a first input signal $V_{IN1}$, and a gate electrode 130 of the first right transistor 100*br* may receive a second input signal $V_{IN2}$.

The pair of second transistors 100*dl* and 100*dr* may include a second left transistor 100*dl* and a second right transistor 100*dr*. A second conductive region (source) of the second left transistor 100*dl* may be connected to second conductive regions (drains) of the first transistors 100*bl* and 100*br*. A first region (drain) of the second left transistor 100*d* may be connected to a second region (source) of the second right transistor 100*dr*. A first conductive region (drain) of the second right transistor 100*dr* may be connected to an externally applied voltage $V_{DD}$. A gate electrode 130 of the second left transistor 100*dl* may receive a second input signal $V_{IN2}$, and a gate electrode 100*dr* of the second right transistor 100*dr* may receive a first input signal $V_{IN1}$.

Each of the first transistors 100*bl* and 100*br* may include a first lower interlayer dielectric 203 disposed on a substrate 201; a second lower interlayer dielectric 205 disposed on the first interlayer dielectric 203; a lower gate electrode 130 disposed between the first lower interlayer dielectric 203 and the second lower interlayer dielectric 205; a lower semiconductor column 110 disposed through the second lower interlayer dielectric 205, the lower gate electrode 130, and the first lower interlayer dielectric 203; a lower gate insulating layer 120 disposed between the lower semiconductor column 110 and the lower gate electrode 130; a lower interconnection 253 disposed on the second lower interlayer dielectric 205 and the lower semiconductor column 110; and a third lower interlayer dielectric 206 disposed on the lower interconnection 253.

The lower semiconductor column 110 of each of the first transistors 100*bl* and 100*br* may include a second conductive region 118, a barrier region 116, an intrinsic region 114, and a first conductive region 112 which are sequentially disposed in the vertical direction. The lower semiconductor column 110 may provide an n-channel feedback semiconductor device. The first conductivity type of the first transistors 100*bl* and 100*br* may be n-type and the second conductivity type thereof may be p-type.

Each of the second transistors 100*dl* and 100*dr* may include a first upper interlayer dielectric 303 disposed on the third lower interlayer dielectric 206; a second upper interlayer dielectric 305 disposed on the first upper interlayer dielectric 203; an upper gate electrode 130 disposed between the first upper interlayer dielectric 303 and the second upper interlayer dielectric 305; an upper semiconductor column 110 disposed through the second upper interlayer dielectric 305, the upper gate electrode 130, and the first upper interlayer dielectric 303; an upper gate insulating layer 120 disposed between the upper semiconductor column 110 and the upper gate electrode 130; and an upper interconnection 253 disposed on the second upper interlayer dielectric 305 and the upper semiconductor column 110.

The upper semiconductor column 110 may include a second conductive region 118 of second conductivity type, a barrier region 116 of first conductivity type, an intrinsic region 114, and a first conductivity type 112 of the first conductivity type which are sequentially stacked in the vertical direction. The upper semiconductor column 110 may provide a p-channel feedback semiconductor device. The first conductivity type of the second transistors 100*dl* and 100*dr* may be p-type and the second conductivity type thereof may be n-type.

N-channel semiconductor devices 100*a* and 100*b* and p-channel semiconductor devices 100*c* and 100*d* may be coupled to each other on the same plane or in a vertically stacked structure to provide a logic device such as inverter or NOR or NAND circuit or a synapse-mimicking device.

As described above, a semiconductor device according to an example embodiment of the present disclosure may provide improved integration and reduced power consumption while utilizing a conventional CMOS process.

A semiconductor device according to an example embodiment of the present disclosure may provide a neuron-mimicking device using a memorable logic element.

A semiconductor device according to an example embodiment of the present disclosure may provide a next-generation high-speed neuromorphic device that exceeds an advanced von Neumann architecture in which a processor and a memory are isolated from each other.

A semiconductor device according to an example embodiment of the present disclosure provides a device in which a processor and a memory are functionally converged to reduce power consumption.

Although the present disclosure and its advantages have been described in detail, it should be understood that various changes, substitutions and alterations can be made herein without departing from the spirit and scope of the disclosure as defined by the following claims.

What is claimed is:

1. A semiconductor device comprising:
    a plurality of stacked transistors,
    wherein:

each of the transistors comprises:
a semiconductor column including a first conductive region of a first conductivity type, a second conductive region of a second conductivity type, an intrinsic region disposed between the first conductive region and the second conductive region, and a barrier region of the first conductivity type disposed between the intrinsic region and the second conductive region;
a gate electrode disposed to cover the intrinsic region; and
a gate insulating layer disposed between the gate electrode and the intrinsic region;
wherein not all of the plurality of stacked transistors have a same first conductivity type, and
wherein:
the plurality of stacked transistors include a first transistor disposed at a lower portion and a second transistor disposed above the first transistor,
the first conductivity type of the first transistor is n-type, and
the first conductivity type of the second transistor is p-type.

2. The semiconductor device as set forth in claim 1, wherein:
the semiconductor column of the first transistor includes the first conductive region, the intrinsic region, the barrier region, and the second conductive region which are sequentially disposed in a vertical direction, and
the semiconductor column of the second transistor includes the second conductive region, the barrier region, the intrinsic region, and the first conductive region which are sequentially disposed in the vertical direction.

3. The semiconductor device as set forth in claim 2, wherein:
the gate electrode of the first transistor is electrically connected to the gate electrode of the second transistor to receive an input signal indicating logic "1" or "0",
the second gate electrode of the first transistor is electrically connected to the second region of the second transistor to provide an output signal,
the first conductive region of the first transistor is grounded,
the first conductive region of the second transistor is connected to an applied voltage,
the first transistor and the second transistor provide a logic inverter, and
the input signal and the output signal are opposite in sign.

4. The semiconductor device as set forth in claim 3, wherein:
the logic inverter retains an output signal of a previous state even when the input signal is removed from the gate electrode of the first transistor.

5. The semiconductor device as set forth in claim 1, wherein:
the semiconductor column of the first transistor includes the second conductive region, the barrier region, the intrinsic region, and the first conductive region which are sequentially disposed in a vertical direction, and
the semiconductor column of the second transistor includes the second conductive region, the barrier region, the intrinsic region, and the first conductive region which are sequentially disposed in the vertical direction.

6. The semiconductor device as set forth in claim 1, wherein:

the plurality of stacked transistors include a pair of first transistors disposed at a lower layer and a pair of second transistors disposed at an upper layer,
the semiconductor column of the first transistor includes the first conductive region, the intrinsic region, the barrier region, and the second conductive region which are sequentially disposed in a vertical direction,
the semiconductor column of the second transistor includes the second conductive region, the barrier region, the intrinsic region, and the first conductive region which are sequentially disposed in the vertical direction, and
the first transistor and the second transistor constitute a NOR logic circuit or a NAND logic circuit.

7. The semiconductor device as set forth in claim 1, wherein:
the plurality of stacked transistors include a pair of first transistors disposed at a lower layer and a pair of second transistors disposed at an upper layer,
the semiconductor column of the first transistor includes the second conductive region, the barrier region, the intrinsic region, and the first conductive region which are sequentially disposed in a vertical direction,
the semiconductor column of the second transistor includes the second conductive region, the barrier region, the intrinsic region, and the first conductive region which are sequentially disposed in the vertical direction, and
the first transistor and the second transistor constitute a NOR logic circuit or a NAND logic circuit.

8. The semiconductor device as set forth in claim 1, wherein:
the first transistor includes:
a first lower interlayer dielectric disposed on a substrate;
a second lower interlayer dielectric disposed on the first lower interlayer dielectric;
a lower gate electrode disposed between the first lower interlayer dielectric and the second lower interlayer dielectric;
a lower semiconductor column disposed through the second lower interlayer dielectric, the lower gate electrode, and the first lower interlayer dielectric;
a lower gate insulating layer disposed between the lower semiconductor column and the lower gate electrode;
a lower interconnection disposed on the second lower interlayer dielectric and the lower semiconductor column; and
a third lower interlayer dielectric disposed on the lower interconnection.

9. The semiconductor device as set forth in claim 8, wherein:
the second transistor includes:
a first upper interlayer dielectric disposed on the third lower interlayer dielectric;
a second upper interlayer dielectric disposed on the first upper interlayer dielectric;
an upper gate electrode disposed between the first upper interlayer dielectric and the second upper interlayer dielectric;
an upper semiconductor column disposed through the second upper interlayer dielectric, the upper gate electrode, and the first upper interlayer dielectric;
an upper gate insulating layer disposed between the upper semiconductor column and the upper gate electrode; and an upper interconnection disposed between the second upper interlayer dielectric and the upper semiconductor column.

10. The semiconductor device as set forth in claim 1, wherein:
the first transistor includes:
a first lower interlayer dielectric disposed on a substrate;
a second lower interlayer dielectric disposed on the first lower interlayer dielectric;
the gate electrode disposed between the first lower interlayer dielectric and the second lower interlayer dielectric;
the semiconductor column disposed through the second lower interlayer dielectric, the gate electrode, and the first lower interlayer dielectric;
the gate insulating layer disposed between the semiconductor column and the gate electrode;
a lower interconnection disposed on the second lower interlayer dielectric and the semiconductor column; and
a third lower interlayer dielectric disposed on the lower interconnection, and further comprising:
a gate isolation layer isolating the gate electrode;
a lower auxiliary interconnection extending in contact with a bottom surface of the semiconductor column; and
a lower interconnection contact plug connected to the lower auxiliary interconnection through the gate isolation layer.

11. The semiconductor device as set forth in claim 9, further comprising:
an upper gate isolation layer isolating the upper gate electrode;
an upper auxiliary interconnection extending in contact with a bottom surface of the upper semiconductor column; and
an upper interconnection contact plug connected to the upper auxiliary interconnection through the upper gate isolation layer.

12. A semiconductor device comprising:
a plurality of stacked transistors,
wherein:
the plurality of stacked transistors comprise:
a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region;
a gate electrode disposed to cover the intrinsic region; and
a gate insulating layer disposed between the gate electrode and the intrinsic region,
wherein not all of the plurality of stacked transistors have a same first conductive type,
wherein:
the plurality of stacked transistors include a pair of first transistors disposed at a lower layer and a pair of second transistors disposed at an upper layer, and
the first transistor and the second transistor constitute a NOR logic circuit or a NAND logic circuit.

13. The semiconductor device as set forth in claim 12, wherein:
an input signal applied to the gate electrode of the transistor is a positive first gate voltage indicating a first logic state and a negative second gate voltage indicating a second logic state, and
the NOR logic circuit or the NAND logic circuit outputs data of a previous state even when the input signal is removed.

14. A semiconductor device comprising:
a plurality of stacked transistors,
wherein:
each of the transistors comprises:
a semiconductor column including a first conductive region of a first conductivity type, a second conductive region of a second conductivity type, an intrinsic region disposed between the first conductive region and the second conductive region, and a barrier region of the first conductivity type disposed between the intrinsic region and the second conductive region;
a gate electrode disposed to cover the intrinsic region; and
a gate insulating layer disposed between the gate electrode and the intrinsic region,
wherein not all of the plurality of stacked transistors have a same first conductive type,
wherein:
the plurality of stacked transistors include an n-channel semiconductor device in which the first conductivity type of the semiconductor column is n-type and a p-channel semiconductor device in which the first conductivity type of the semiconductor column is p-type, respectively, and
the plurality of stacked transistors is configured to perform at least one of inverter, NAND, and NOR logic operations.

15. The semiconductor device as set forth in claim 14, wherein:
the p-channel semiconductor device and the n-channel semiconductor device have a stacked structure.

* * * * *